(12) United States Patent
Kim et al.

(10) Patent No.: US 10,923,428 B2
(45) Date of Patent: Feb. 16, 2021

(54) SEMICONDUCTOR PACKAGE HAVING SECOND PAD ELECTRICALLY CONNECTED THROUGH THE INTERPOSER CHIP TO THE FIRST PAD

(71) Applicant: SAMSUNG ELECTRONICS CO., LTD., Suwon-si (KR)

(72) Inventors: Ji Hwang Kim, Chungcheongnam-Do (KR); Kilsoo Kim, Hwaseong-si (KR); Jongbo Shim, Asan-si (KR); Jangwoo Lee, Asan-si (KR); Eunhee Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 7 days.

(21) Appl. No.: 16/432,551

(22) Filed: Jun. 5, 2019

(65) Prior Publication Data
US 2020/0020637 A1    Jan. 16, 2020

(30) Foreign Application Priority Data

Jul. 13, 2018   (KR) .................. 10-2018-0081705

(51) Int. Cl.
*H01L 23/00* (2006.01)
*H01L 23/538* (2006.01)
*H01L 23/498* (2006.01)

(52) U.S. Cl.
CPC .... *H01L 23/5385* (2013.01); *H01L 23/49816* (2013.01); *H01L 23/5383* (2013.01); *H01L 23/5386* (2013.01); *H01L 24/14* (2013.01)

(58) Field of Classification Search
CPC ....... H01L 2225/1041; H01L 2225/107; H01L 2224/48227; H01L 2224/73253; H01L 2224/97; H01L 24/97; H01L 23/49816; H01L 23/52; H01L 23/538; H01L 25/043; H01L 25/0657; H01L 25/0756; H01L 25/117
See application file for complete search history.

(56) References Cited

U.S. PATENT DOCUMENTS

| | | | |
|---|---|---|---|
| 7,391,105 | B2 | 6/2008 | Yeom |
| 7,750,455 | B2 | 7/2010 | Pagaila et al. |
| 8,053,881 | B2 | 11/2011 | Kim et al. |
| 8,354,742 | B2 | 1/2013 | Camacho et al. |
| 8,378,477 | B2 | 2/2013 | Do et al. |
| 8,530,277 | B2 | 9/2013 | Ko et al. |

(Continued)

FOREIGN PATENT DOCUMENTS

| | | |
|---|---|---|
| JP | 2011233672 A | 11/2011 |
| KR | 20080085441 A | 9/2008 |
| KR | 20110091189 A | 8/2011 |

*Primary Examiner* — Hoai V Pham
(74) *Attorney, Agent, or Firm* — Volentine, Whitt & Francos, PLLC

(57) ABSTRACT

A semiconductor package includes a substrate, a semiconductor chip mounted on the substrate, an interposer chip on the semiconductor chip and including a redistribution pattern, a first pad on the interposer chip, a second pad on the interposer chip and spaced apart from the first pad, and a bonding wire electrically connected to the second pad and the first substrate. The second pad is electrically connected through the redistribution pattern to the first pad. The footprint of the interposer chip is greater than the footprint of the first semiconductor chip.

20 Claims, 23 Drawing Sheets

(56) References Cited

U.S. PATENT DOCUMENTS

| | | |
|---|---|---|
| 9,831,214 B2 | 11/2017 | Chen et al. |
| 9,859,263 B2 | 1/2018 | Kwon et al. |
| 2008/0105962 A1 | 5/2008 | Lee et al. |
| 2012/0326306 A1 | 12/2012 | Lee |
| 2015/0108656 A1 | 4/2015 | Juneja et al. |
| 2015/0130078 A1 | 5/2015 | Hong et al. |
| 2016/0329262 A1 | 11/2016 | Hsiao et al. |
| 2018/0005974 A1 | 1/2018 | Chiu et al. |
| 2020/0020613 A1* | 1/2020 | Kim ............ H01L 25/0657 |

* cited by examiner

SEMICONDUCTOR PACKAGE HAVING SECOND PAD ELECTRICALLY CONNECTED THROUGH THE INTERPOSER CHIP TO THE FIRST PAD

PRIORITY STATEMENT

This U.S. nonprovisional application claims priority under 35 U.S.C § 119 to Korean Patent Application No. 10-2018-0081705 filed on Jul. 13, 2018 in the Korean Intellectual Property Office, the entire contents of which are hereby incorporated by reference.

BACKGROUND

The present inventive concepts relate to a semiconductor package. More particularly, the inventive concept relates to a chip stack package, such as package on package (PoP) and to a semiconductor package that may be used in fabricating the same.

A semiconductor package is provided to provide an integrated circuit(s) for use in electronic products. A semiconductor package is typically configured such that a semiconductor chip is mounted on a printed circuit board (PCB) and bonding wires or bumps are used to electrically connect the semiconductor chip to the printed circuit board. As the electronics industry continues to evolve, many studies have been conducted aimed at increasing the functionality and improving the reliability and durability of semiconductor packages.

SUMMARY

According to one aspect of the present inventive concepts, there is provided a semiconductor package comprising a first substrate, a first semiconductor chip disposed on and mounted to the first substrate, an interposer chip on the first semiconductor chip, a first pad disposed on the interposer chip, a second pad disposed on the interposer chip and spaced apart from the first pad, and a bonding wire electrically connected to the second pad and the first substrate, and in which the second pad is electrically connected through the interposer chip to the first pad, and the interposer chip has a footprint greater than that of the first semiconductor chip.

According to another aspect of the present inventive concepts, there is also provided a semiconductor package comprising a first substrate, a first semiconductor chip disposed on and mounted to the first substrate, a dummy chip disposed on the first semiconductor chip and having a footprint greater than that of the first semiconductor chip, a redistribution layer on a top surface of the dummy chip, a plurality of solder ball pads on the redistribution layer, a bonding wire pad connected to the redistribution layer and electrically connected through the redistribution layer to at least one of the solder ball pads, and a molding layer disposed on the first substrate and covering the redistribution layer and the bonding wire pad, and in which the molding layer has a plurality of openings that lead to and open at the solder ball pads.

According to still another aspect of the present inventive concepts, there is provided a semiconductor package comprising a first substrate including a substrate pad, a first semiconductor chip disposed on and mounted to the first substrate, an interposer chip disposed on the first semiconductor chip and including a redistribution layer comprising a wiring pattern, a solder ball on a top surface of the interposer chip, and a bonding wire extending from the top surface of the interposer chip, and in which the bonding wire is coupled to the substrate pad, the solder ball is electrically connected through the redistribution layer to the bonding wire, and the interposer chip has a width greater than a width of the first semiconductor chip in a direction parallel to an upper surface of the first substrate.

According to still another aspect of the present inventive concepts, there is provided a semiconductor package comprising a first substrate including an insulating body, and first substrate pads and second substrate pads of electrically conductive material at a top surface of the insulating body, a first semiconductor chip flip-chip mounted to the first substrate as disposed on and electrically connected to the first substrate pads of the first substrate, an interposer on the first semiconductor chip, the interposer having an upper portion including a redistribution layer comprising wiring patterns, a plurality of first pads of electrically conductive material disposed on the interposer, a plurality of second pads of electrically conductive material disposed on the interposer and spaced laterally outwardly of the plurality of first pads, bonding wires electrically connecting the second pads disposed on the interposer and the second substrate pads, respectively; and a molding layer disposed on the first substrate and in which the interposer, the first semiconductor chip and the bonding wires are encapsulated, and in which the second pads are electrically connected by the wiring patterns of the redistribution layer of the interposer to the first pads, and the molding layer has a plurality of openings therein that leads to and opens at the plurality of first pads disposed on the interposer.

DETAILED DESCRIPTION

Figure 1A:
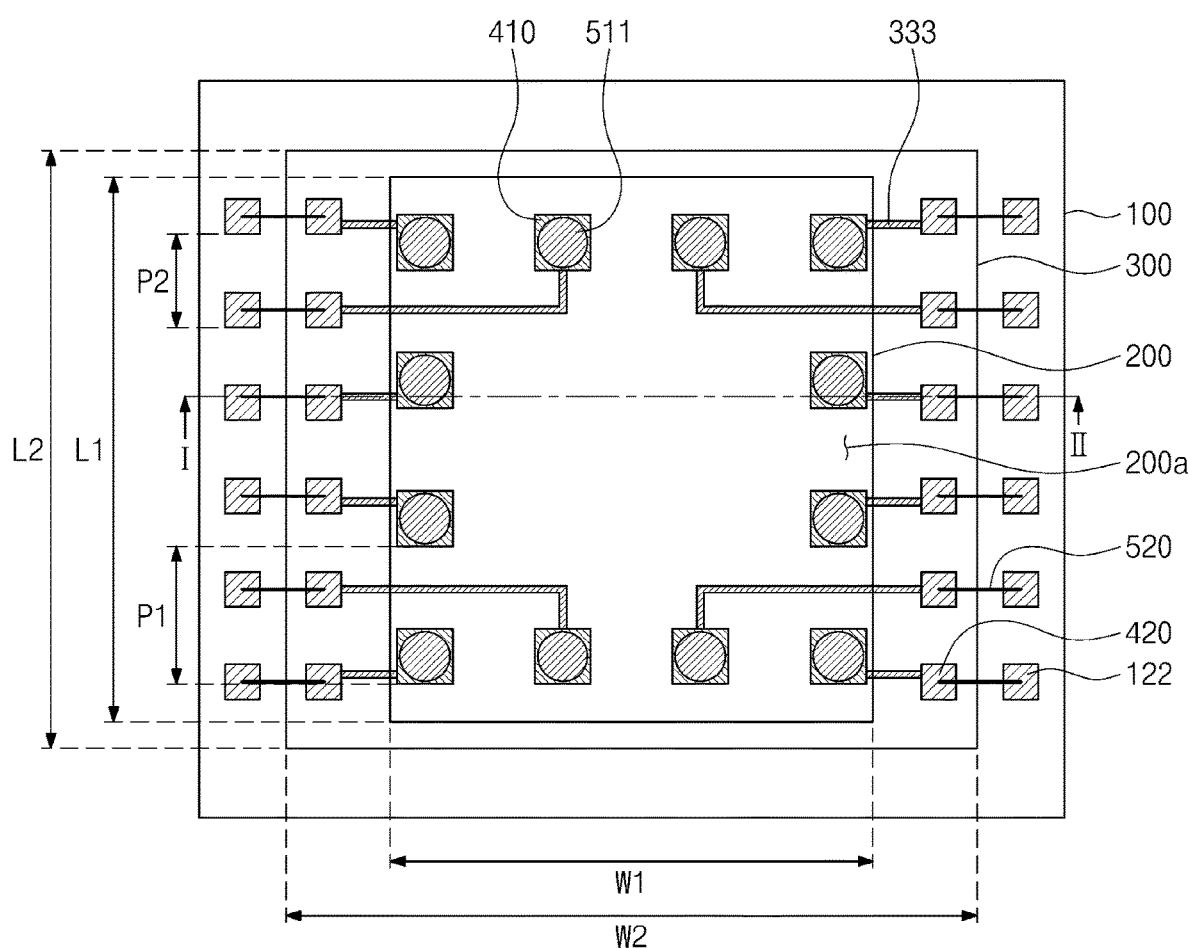
FIG. 1A is a plan view of a first example of a semiconductor package according to the present inventive concepts.

Various examples of semiconductor packages according to the present inventive concepts will now be described in detail with reference to the drawings. Like reference numerals designate like components throughout the drawings. Also, the description may refer to the packages as having a particular element or feature in the singular for simplicity. However, as shown in the drawings, the examples of the packages may have a plurality of similar elements or features to which the written description equally applies. Also, unless otherwise indicated, features and aspects of the present inventive concepts described in connection with one example and similar, as is clear from the drawings, to those of subsequent examples may not be described again in detail for the sake of brevity.

Figure 1B:
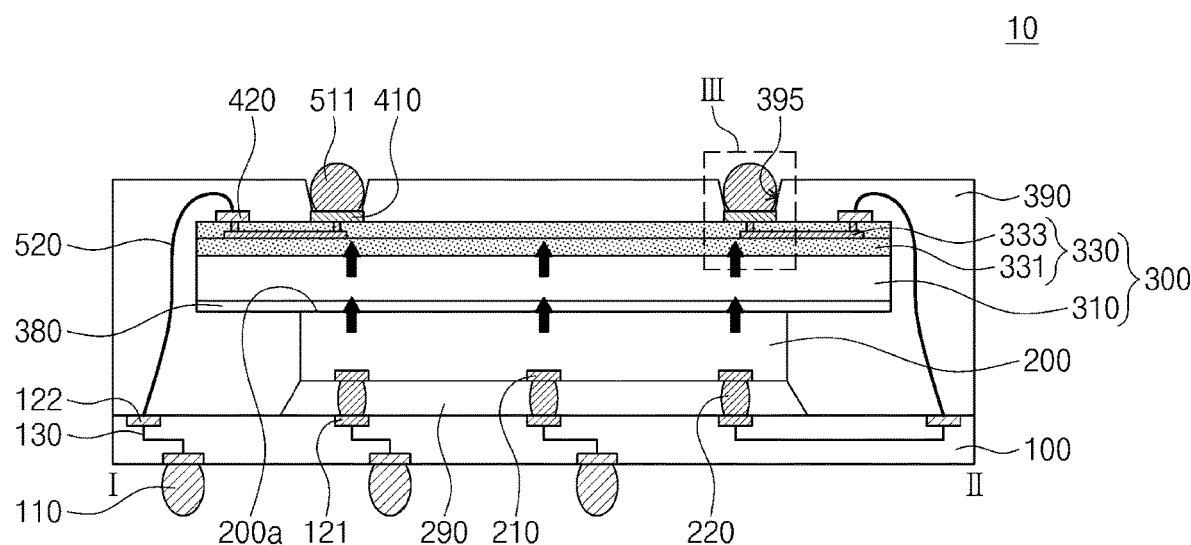
FIG. 1B is a cross-sectional view taken along line I-II of FIG. 1A.
Figure 1C:
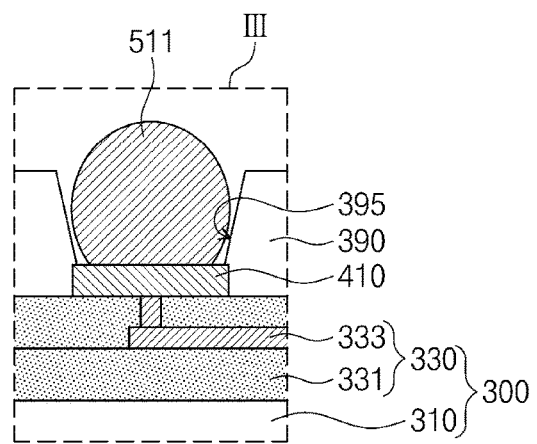
FIG. 1C is an enlarged view of section III of FIG. 1B.

A first example of a semiconductor package 10 according to the present inventive concepts is illustrated in FIGS. 1A, 1B, and 1C. The first package 10 may include a first substrate 100, a first semiconductor chip 200, an interposer 300 in chip form (referred to hereinafter as "interposer chip 300"), a bonding wire 520, and a body of molded material 390 (referred to hereinafter as "first molding layer 390"). A printed circuit board or a structure having redistribution wiring may be used as the first substrate 100. The first substrate 100 may have an insulating body (one or more layers of insulating material) provided on its top surface with substrate pads. The substrate pads may include first substrate pads 121 and second substrate pads 122. The second substrate pads 122 may be closer than the first substrate pads 121 to an edge region of the first substrate 100. The first and second substrate pads 121 and 122 may be electrically connected through internal interconnections 130 (shown schematically by the solid lines) to external terminals 110. The phrase "electrically connected to the first substrate 100" as used hereinafter may mean "electrically connected to the internal interconnections 130." The external terminals 110 may be provided on a bottom surface of the insulating body of the first substrate 100. The external terminals 110 may include solder balls. The external terminals 110 may be coupled to an external device. The substrate pads 121 and 122, the external terminals 110, and the internal interconnections 130 are formed of conductive material such as a metal.

The first semiconductor chip 200 may be flip-chip mounted to the first substrate 100. The first semiconductor chip 200 may be a logic chip or an application processor (AP). The first semiconductor chip 200 may be a system-on-chip. The first semiconductor chip 200 may have therein integrated circuits which integrated circuits may include a logic circuit, a memory circuit, or a combination thereof. A first chip pad 210 may be provided at a bottom of the first semiconductor chip 200, i.e., at a surface of the first semiconductor chip 200 facing the first substrate 100. The first chip pad 210 may be electrically connected to the integrated circuits of the first semiconductor chip 200. The bottom surface of the first semiconductor chip 200 may thus be the active surface of the chip. The top surface 200a of the first semiconductor chip 200 may be an inactive surface. The phrase "electrically connected to the first pad 410" may thus have essentially the same meaning as "electrically connected to the first semiconductor chip 200." Likewise, the phrase "electrically connected to the first semiconductor chip 200" may thus have essentially the same meaning as "electrically connected to the integrated circuits of the first semiconductor chip 200."

A connection terminal 220 may be provided between the first substrate 100 and the first semiconductor chip 200 and may be electrically connected to the first substrate 100 and the first semiconductor chip 200. The connection terminal 220 may include one or more of a solder ball, a bump, and a pillar. The connection terminal 220 is of conductive material such as a metal. An under-fill layer 290 may be provided in a gap between the first substrate 100 and the first semiconductor chip 200 and may encapsulate the connection terminal 220. The under-fill layer 290 may comprise a dielectric polymer.

In another example of the semiconductor package according to the present inventive concepts, a thermos-compression bonding technique may be used to mount the first semiconductor chip 200 on the first substrate 100. In this case, the first semiconductor chip 200 physically contacts the first substrate 100, and the first chip pad 210 is directly coupled to the first substrate pad 121.

The interposer chip 300 is disposed on the first semiconductor chip 200. The interposer chip 300 may include a base substrate 310 and a redistribution layer 330. The interposer chip 300 does not include integrated circuits or transistors. The base substrate 310 may be a dummy chip. A semiconductor substrate may be used as the base substrate 310. The semiconductor substrate may be a substrate (plate-like body) consisting of silicon, silicon germanium, or silicon carbide. The base substrate 310 has top and bottom surfaces facing in opposite directions. The bottom surface of the base substrate 310 faces the first semiconductor chip 200. The interposer chip 300 including the base substrate 310 may have a relatively high thermal conductivity. The interposer chip 300 may have a thermal conductivity greater than that of a printed circuit board. For example, the interposer chip 300 may have a thermal conductivity equal to or greater than about 30 W/mK, and preferably from about 30 W/mK to about 2000 W/mK. The first semiconductor chip 200 may generate heat during its operation. As expressed by arrows, heat generated from the first semiconductor chip 200 may be promptly released through the interposer chip 300. Accordingly, the first semiconductor chip 200 may have excellent thermal characteristics and operational reliability.

The higher the performance of the first semiconductor chip 200, the greater is the amount of heat generated by the first semiconductor chip 200. According to examples of the present inventive concepts in which the interposer chip 300 has a thermal release function as described above, a high-performance semiconductor chip may be used as the first semiconductor chip 200.

As shown in FIG. 1A, the interposer chip 300 may have a length L2 equal to or greater than a length L1 of the first semiconductor chip 200. A width W2 of the interposer chip 300 may be equal to or greater than a width W1 of the first semiconductor chip 200. In this case, the interposer chip 300 completely covers the top surface 200*a* of the first semiconductor chip 200. Also, the interposer chip 300 may have a planar area greater than that of the first semiconductor chip 200 such that an edge region of the interposer chip 300 does not lie on the first semiconductor chip 200. Because the top surface 200*a* of the first semiconductor chip 200 completely covers or overlaps the interposer chip 300, heat generated from the first semiconductor chip 200 may be rapidly delivered to the interposer chip 300. The interposer chip 300 may be relatively thin, and thus the first package 10 may be relatively compact.

An adhesive layer 380 may be provided between the first semiconductor chip 200 and the interposer chip 300. The interposer chip 300 may be attached through the adhesive layer 380 to the first semiconductor chip 200. The adhesive layer 380 may extend onto a bottom surface of the edge region of the interposer chip 300. The adhesive layer 380 may include a dielectric polymer and a plurality of particles. The particles may be distributed in the dielectric polymer. The particles may include a thermally conductive material. For example, the particles may have a thermal conductivity greater than that of the adhesive layer 380. The particles may include metal, but the present inventive concepts are not limited thereto. The particles may cause the adhesive layer 380 to have a relatively high thermal conductivity. For example, the adhesive layer 380 may have a thermal conductivity equal to or greater than about 0.2 W/mK, and preferably from about 0.2 W/mK to about 10 W/mK. Heat generated from the first semiconductor chip 200 may be immediately transmitted through the adhesive layer 380 to the interposer chip 300.

The redistribution layer 330 is provided on the top surface of the base substrate 310. The redistribution layer 330 may include a dielectric portion of one or more layers of dielectric material (e.g. at least one of dielectric layer 331) and a redistribution pattern 333. The dielectric layer 331 may be formed of a dielectric polymer or a silicon-containing dielectric material. The dielectric polymer may be, for example, photosensitive polyimide (PSPI), polybenzoxazole (PBO), a phenolic polymer, a benzocyclobutene (BCB) based polymer, or a combination thereof. The silicon-containing dielectric material may be silicon oxide, silicon nitride, silicon oxynitride, tetraethylorthosilicate (TEOS), or a combination thereof.

The redistribution pattern 333 may include a via portion (one or more vias) and a line portion (a conductive line or "trace"). The via portion of the redistribution pattern 333 extends vertically in one of the dielectric layers 331. The line portion of the redistribution pattern 333 may be provided on a surface of one of the dielectric layers 331. The line portion of the redistribution pattern 333 is connected to the via portion of the redistribution pattern 333. The phrase "electrically connected to the redistribution layer 330" may have essentially the same meaning as "electrically connected to the redistribution pattern 333." The redistribution pattern 333 may be formed of a metal, such as copper. The redistribution pattern 333 may comprise a plurality of discrete line portions and a respective via(s) in contact therewith.

The interposer chip 300 may be provided with first pads 410 and second pads 420 on an uppermost one of the dielectric layers 331. As shown in FIG. 1A, the first pads 410 may be arranged at a first pitch P1. The first pitch P1 may be greater than a pitch P2 of the second substrate pads 122. The first pads 410 comprise a metal, such as aluminum.

First solder balls 511 may be provided on the first pads 410, respectively. The first semiconductor chip 200 may be electrically connected through the first solder balls 511 to an external semiconductor chip or an external package. The first solder balls 511 include a conductive material such as tin, silver, bismuth, or any alloy thereof. The first solder balls 511 may be arranged at a pitch similar to the first pitch P1. In another example, the first solder balls 511 are omitted.

The second pads 420 may be closer than the first pads 410 to a side surface of the interposer chip 300. The second pads 420 may be electrically connected through the redistribution pattern 333 to at least one of the first pads 410. A single process may be performed to form the second pads 420 together with the first pads 410. For example, a conductive layer may be formed on the redistribution layer 330. The conductive layer may be patterned to form the first pads 410 and the second pads 420. In this case, the second pads 420 may include the same material as that of the first pads 410, and may have substantially the same thickness as that of the first pads 410. Thus, the second pads 420 may be formed of, for example, aluminum. Alternatively, the second pads 420 may be formed separately from the first pads 410. In this case, the second pads 420 may include a different material from that of the first pads 410. For example, the second pads 420 may be formed of nickel, copper, aluminum, a solder material, or any alloy thereof. The solder material may include tin, silver, bismuth, or any alloy thereof.

In examples of the present inventive concepts in which the planar area of the interposer chip 300 is greater than the planar area of the first semiconductor chip 200, the layout of the first pads 410 and the second pads 420 enjoys a high degree of freedom.

The bonding wire 520 may be coupled to one of the second pads 420 and the second substrate pad 122. Thus, the second pad 420 may be electrically connected through the bonding wire 520 to the internal interconnections 130. Because in this example the planar area of the interposer chip 300 is greater than the planar area of the first semiconductor chip 200, the bonding wire 520 may be spaced relatively far apart from the first semiconductor chip 200. Therefore, the bonding wire 520 may be easily electrically connected to the first substrate 100. The bonding wire 520 may be formed of a metal, such as gold or copper.

The first molding layer 390 may be provided on the first substrate 100 and the interposer chip 300. The first molding layer 390 may cover and protect the bonding wire 520 and the second pad 420. Thus, the second pad 420 may not be damaged by foreign substances (e.g., moisture or air). The first molding layer 390 may have openings 395. A drilling process may be performed to form the openings 395. As shown in FIG. 1C, the openings 395 may respectively expose top surfaces of the first pads 410. Side surfaces of the first pads 410 may be covered, though, by the first molding layer 390. After the openings 395 are formed, the first solder balls 511 may be correspondingly formed on the first pads 410 exposed by the openings 395. At this time, the opening 395 may still be considered as leading to and opening at (the top surface of) the first pad 410. The first solder balls 511 may have their uppermost surfaces at a level higher than that of an uppermost surface of the first molding layer 390.

The first molding layer 390 may cover and protect the redistribution layer 330. For example, the first molding layer 390 may prevent the redistribution pattern 333 from damage (e.g., corrosion) resulting from foreign substances. The first molding layer 390 may fill a gap between the top surface of the first substrate 100 and the bottom surface of the edge region of the interposer chip 300. The first molding layer 390 may be formed of a dielectric polymer such as an epoxy molding compound (EMC).

FIGS. 1D to 1H illustrate other versions of an opening and a first pad according to the present inventive concepts, each corresponding to an enlarged view of section III of FIG. 1B.

Figure 1D:
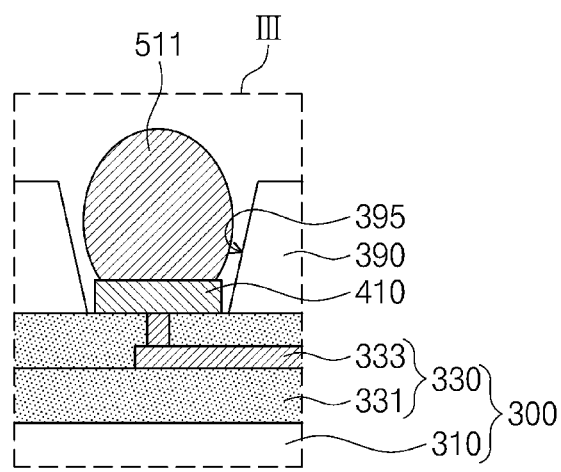
FIG. 1D is a cross-sectional view of one version of an opening and a first pad of the first example of the semiconductor package according to the present inventive concepts.

Referring to FIG. 1D, the opening 395 may completely expose the top surface of the first pad 410. The opening 395 may also expose the side surface of the first pad 410. The first solder ball 511 may be provided on the exposed top surface of the first pad 410. The first solder ball 511 may be spaced apart from a surface of the first molding layer 390 defining the sides of the opening 395.

Figure 1E:
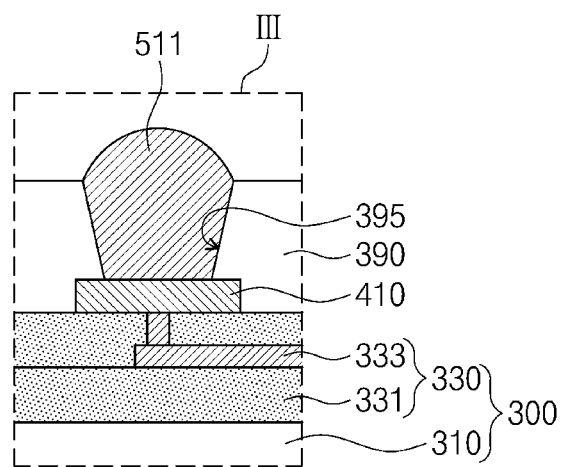
FIG. 1E is a cross-sectional view of another version of an opening and a first pad of the first example of the semiconductor package according to the present inventive concepts.

Referring to FIG. 1E, the opening 395 may expose one portion of the top surface of the first pad 410. The opening 395 may cover another portion of the top surface of the first pad 410 and the side surface of the first pad 410. The first solder ball 511 may be provided on the top surface of the first pad 410 and may fill the opening 395. Thus, the first solder ball 511 may contact the surface of the first molding layer 390 defining the sides of the opening 395.

Figure 1F:
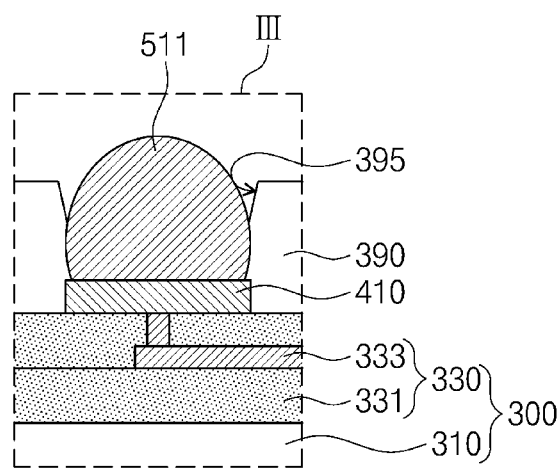
FIG. 1F is a cross-sectional view of another version of an opening and a first pad of the first example of the semiconductor package according to the present inventive concepts.
Figure 1G:
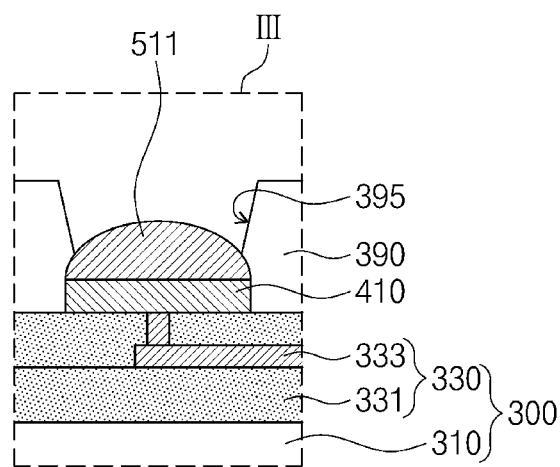
FIG. 1G is a cross-sectional view of another version of an opening and a first pad of the first example of the semiconductor package according to the present inventive concepts.

Referring to FIGS. 1F and 1G, the opening 395 may expose a portion of the first pad 410. The first solder ball 511 may be provided on the top surface of the first pad 410. The first molding layer 390 may contact a portion of the first solder ball 511 and the side surface of the first pad 410. In the example shown in FIG. 1F, the uppermost surface of the first solder ball 511 is located at a level higher than that of the uppermost surface of the first molding layer 390. In the example shown in FIG. 1G, the uppermost surface of the first solder ball 511 is located at a lower level than that of the uppermost surface of the first molding layer 390. In another example, the uppermost surface of the first solder ball 511 is located at the same level as the uppermost surface of the first molding layer 390.

Figure 1H:
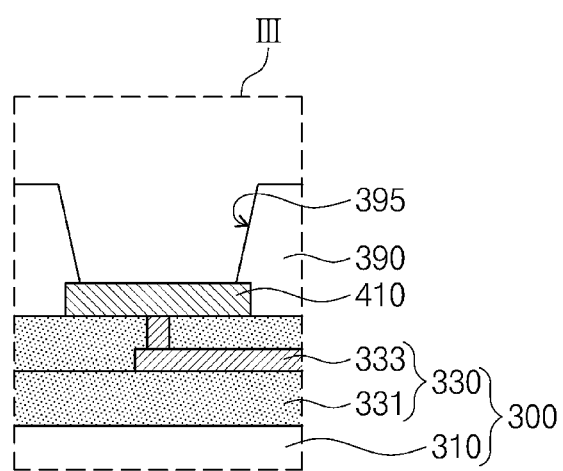
FIG. 1H is a cross-sectional view of still another version of an opening and a first pad of the first example of the semiconductor package according to the present inventive concepts the present inventive concepts.

Referring to FIG. 1H, the opening 395 exposes the top surface of the first pad 410. No solder ball is provided on the top surface of the first pad 410.

Figure 2A:
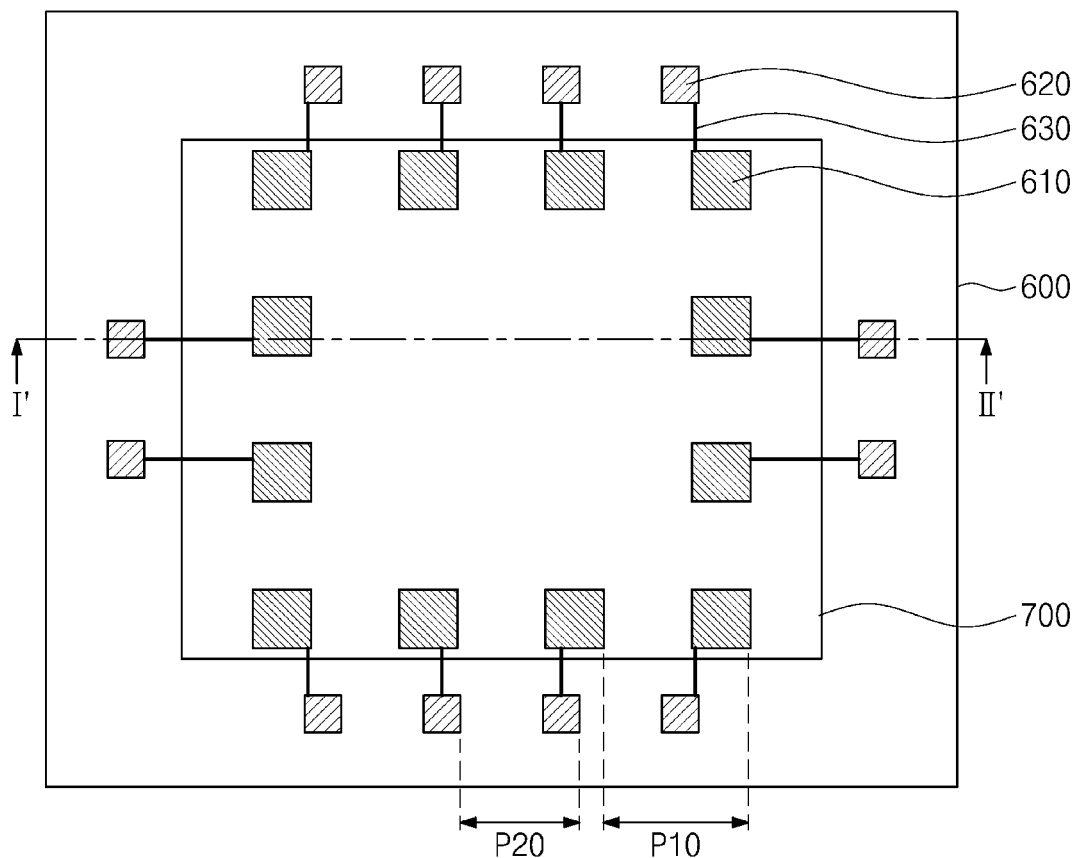
FIG. 2A is a plan view of a second package of a semiconductor package according to the present inventive concepts.
Figure 2B:
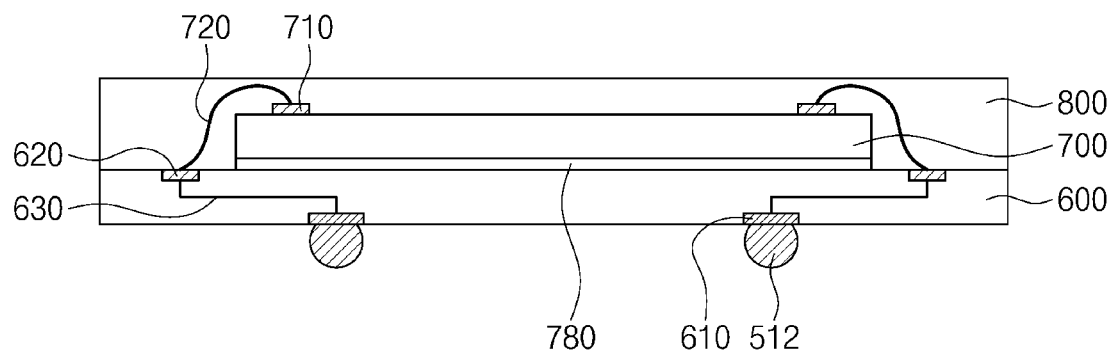
FIG. 2B is a cross-sectional view taken along line I'-II' of FIG. 2A.

FIGS. 2A and 2B illustrate a second package that may constitute a package on package (PoP) according to the present inventive concepts.

Referring to FIGS. 2A and 2B, the second package 20 may include a second substrate 600, a second semiconductor chip 700, and a second molding layer 800. A printed circuit board or a redistribution layer structure may be used as the second substrate 600. The upper pad 620 may be provided on a top surface of the second substrate 600. The upper pad 620 may be formed of a metal such as copper, aluminum, or nickel.

The second semiconductor chip 700 may be mounted on the second substrate 600. The second semiconductor chip 700 may be a memory chip. The second semiconductor chip 700 may be disposed on a central region of the second substrate 600. An adhesive film 780 may be interposed between the second substrate 600 and the second semiconductor chip 700. The adhesive film 780 may include a dielectric resin. A second chip pad 710 may be provided on the top surface of the second semiconductor chip 700 and may be electrically connected to integrated circuits of the second semiconductor chip 700. The phrase "electrically connected to the second semiconductor chip 700" may have essentially the same meaning as "electrically connected to the integrated circuits of the second semiconductor chip 700." The phrase "electrically connected to the second chip pads 710" may have essentially the same meaning as "electrically connected to the second semiconductor chip 700."

One or more connectors 720 may extend from locations proximate the top surface of the second semiconductor chip 700. The connector 720 may be coupled to the second chip pad 710 and to the upper pad 620. The connector 720 may be a bonding wire. The connector 720 is of conductive material such as a metal. The second semiconductor chip 700 may be electrically connected through the connector 720 to the second substrate 600. The phrase "electrically connected to the second substrate 600" may have essentially the same meaning as "electrically connected to internal lines 630 in the second substrate 600."

The second molding layer 800 may be provided on the second substrate 600 to cover the second semiconductor chip 700. The second molding layer 800 may encapsulate the connector 720. The second molding layer 800 may be formed of a dielectric polymer such as an epoxy molding compound.

The upper pads 620 may be spaced laterally of the second semiconductor chip 700. When viewed in plan, the upper pads 620 may be disposed on an edge region of the second substrate 600. The insulating body of the second substrate 600 may be provided on its bottom surface with lower pads 610. The lower pads 610 may be electrically connected to the upper pads 620, respectively, through the internal lines 630 of the second substrate 600. In FIG. 2B, the solid lines schematically illustrate the internal lines 630. The internal lines 630 and the lower pads 610 comprise a metal. As shown in FIG. 2A, the lower pads 610 may be arranged at a second pitch P10. The second pitch P10 and sizes of the lower pads 610 may be standardized. For example, the second pitch P10 may conform to a JEDEC standard. The second pitch P10 may be greater than the pitch P20 of the upper pads 620. A size (surface area or footprint) of each of the lower pads 610 may be greater than a size of each of the upper pads 620. The lower pads 610 may not be aligned with the upper pads 620.

Second solder balls 512 may be provided on the lower pads 610 and may be coupled to the lower pads 610, respectively. The second solder balls 512 include a conductive material such as tin, silver, bismuth, or any alloy thereof. The second solder balls 512 may be arranged at a pitch identical or similar to the second pitch P10.

Figure 3A:
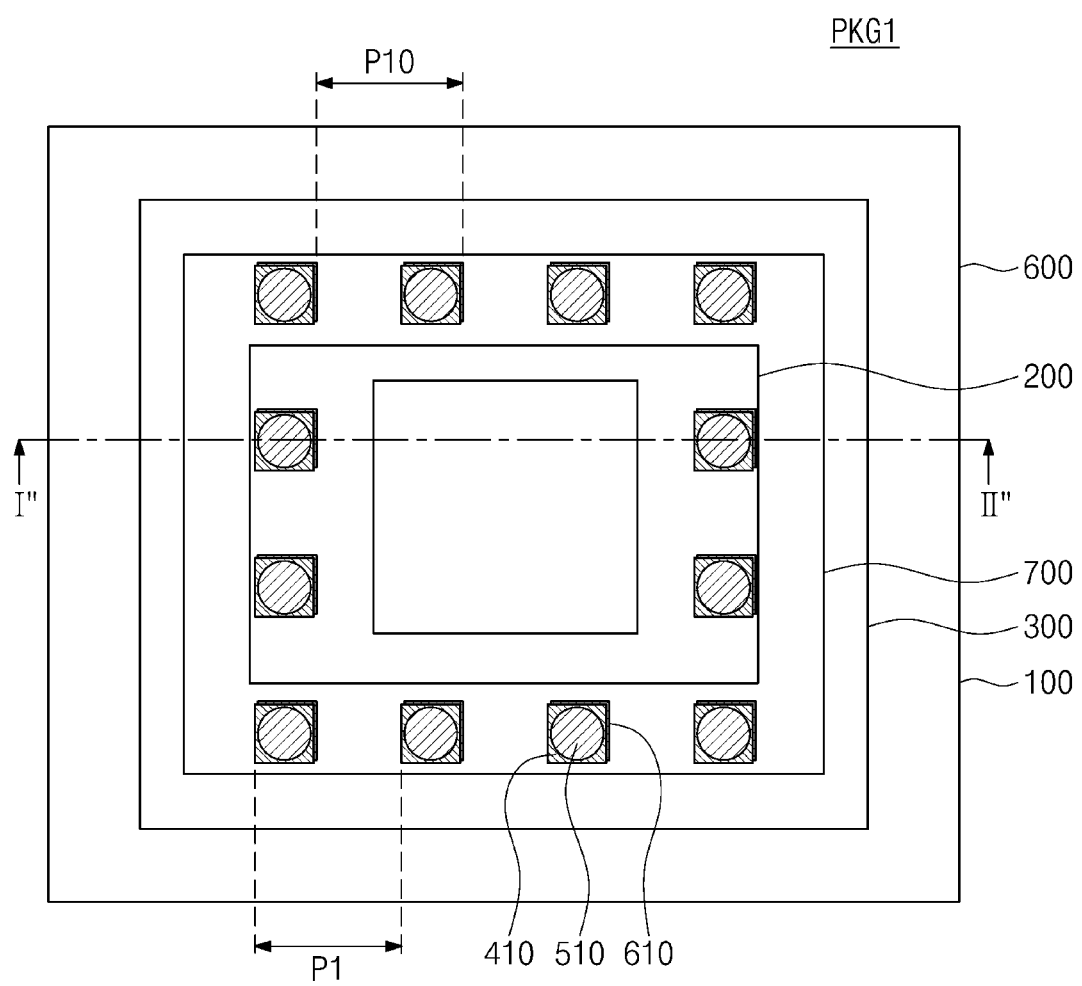
FIG. 3A is a plan view of second example of a semiconductor package according to the present inventive concepts.
Figure 3B:
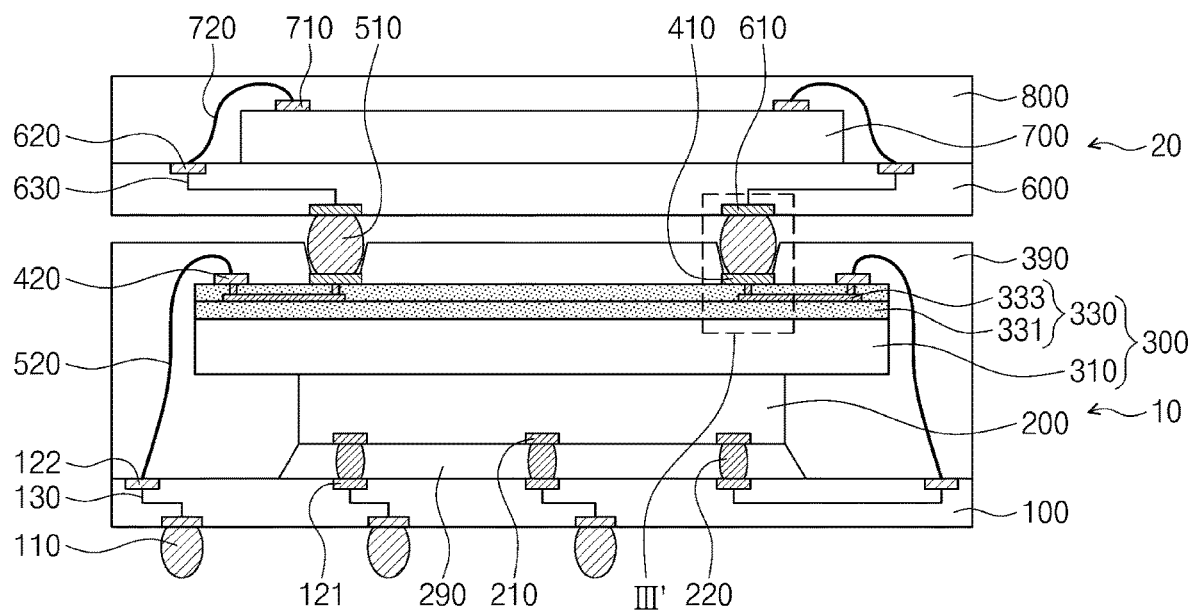
FIG. 3B is a cross-sectional view taken along line I"-II" of FIG. 3A.
Figure 3C:
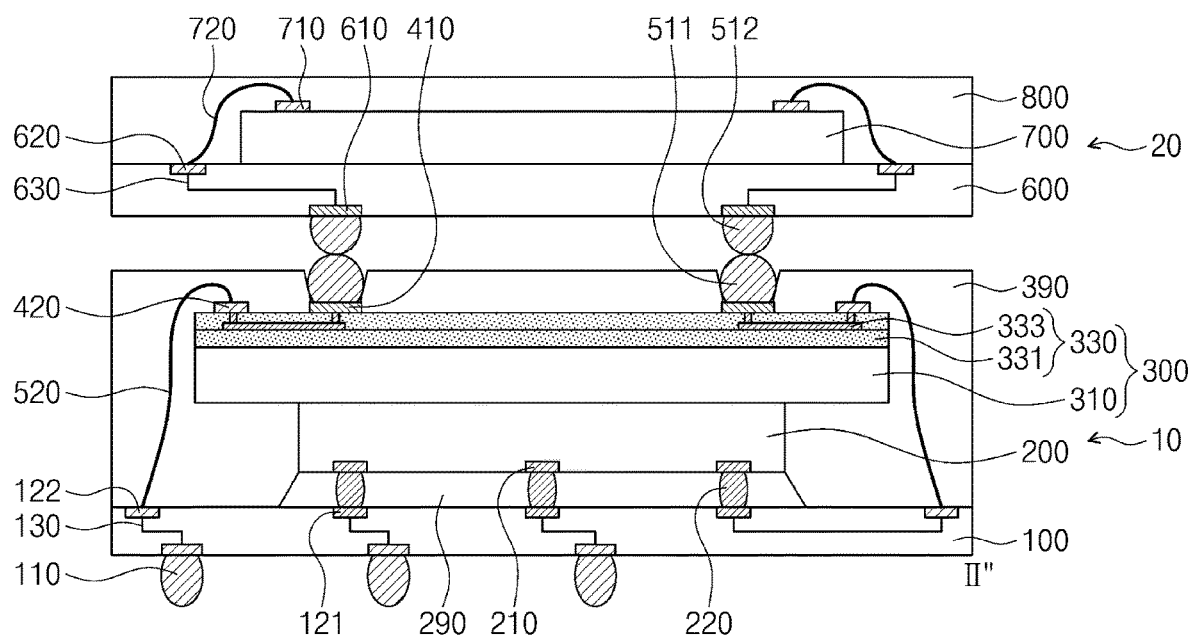
FIG. 3C is a cross-sectional view of the second example of the semiconductor package during the course of its manufacture in a method according to the present inventive concepts.

FIGS. 3A-3C illustrates an example of a semiconductor package PKG1, in this case a package on package, according to the present inventive concepts.

Referring to FIGS. 2A, 3A, and 3B, the semiconductor package PKG1 includes a first package 10 and a second package 20. The first package 10 may be the same as the first package 10 discussed above with reference to FIGS. 1A and 1B. The second package 20 may be the same as the second package 20 discussed above with reference to FIGS. 2A and 2B. The second package 20 is provided on the first package 10. The second package 20 may be electrically connected to the first package 10 through one or more connection structures 510.

Referring to FIG. 3C, the second package 20 may be disposed on the first package 10 with the second solder balls 512 aligned with corresponding ones of the first solder balls 511. After that, a reflow process may be performed. The reflow process may be performed to thermally treat the first solder balls 511 and the second solder balls 512. When the reflow process is performed, the first solder balls 511 and the second solder balls 512 that correspond to each other may be soldered to form the connection structures 510 of FIG. 3B. Examples of the connection structures 510 will be described below with reference to FIGS. 3D to 3F.

Figure 3D:
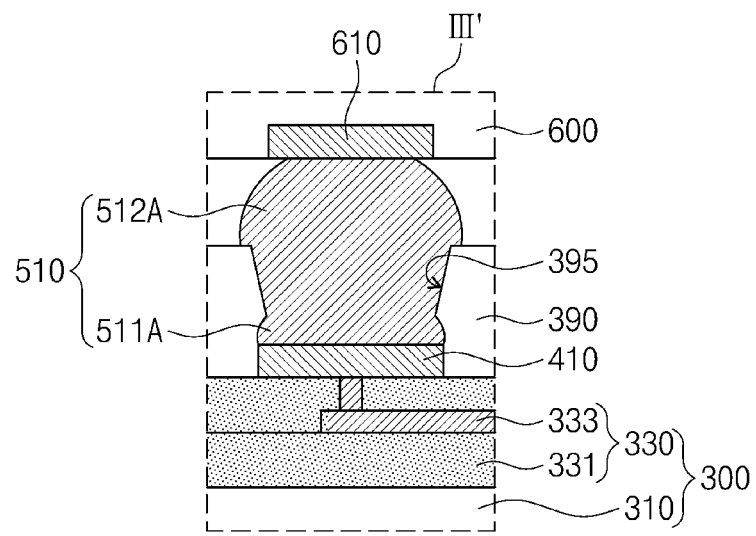
FIG. 3D is a cross-sectional view of a connection structure of the second example of a semiconductor package according to the present inventive concepts.
Figure 3E:
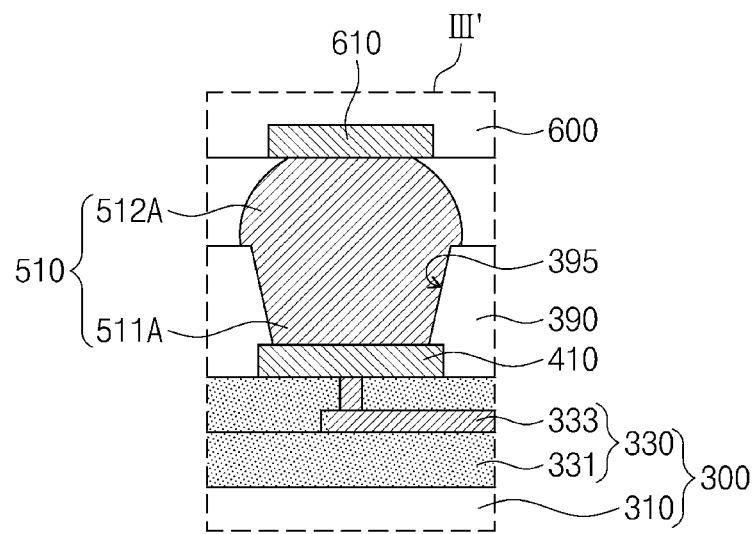
FIG. 3E is a cross-sectional view of another version of the connection structure according to the present inventive concepts.

In the examples of FIGS. 3D and 3E, the connection structure 510 contacts the surface of the first molding layer 390 defining the sides of the opening 395. The connection structure 510 may include an upper portion 512A and a lower portion 511A that are connected to and hence, are integral with each other. The upper portion 512A of the connection structure 510 may originate from one of the second solder balls 512 of FIG. 3C. As shown in FIG. 3D, the connection structure 510 may have a width on the top surface of the first pad 410, which width may be greater than the minimum width of the connection structure 510. In this case, the lower portion 511A of the connection structure 510 originates from the first solder ball 511 of FIG. 1F or 1G. As shown in FIG. 3E, the connection structure 510 may have a width on the top surface of the first pad 410, which width may correspond to the minimum width of the connection structure 510. In this case, the lower portion 511A of the connection structure 510 originates from the first solder ball 511 shown in FIG. 1C or 1E. Alternatively, the forming of the connection structure 510 may include coupling one of the second solder balls 512 shown in FIG. 3C to the first pad 410 shown in FIG. 1H.

Figure 3F:
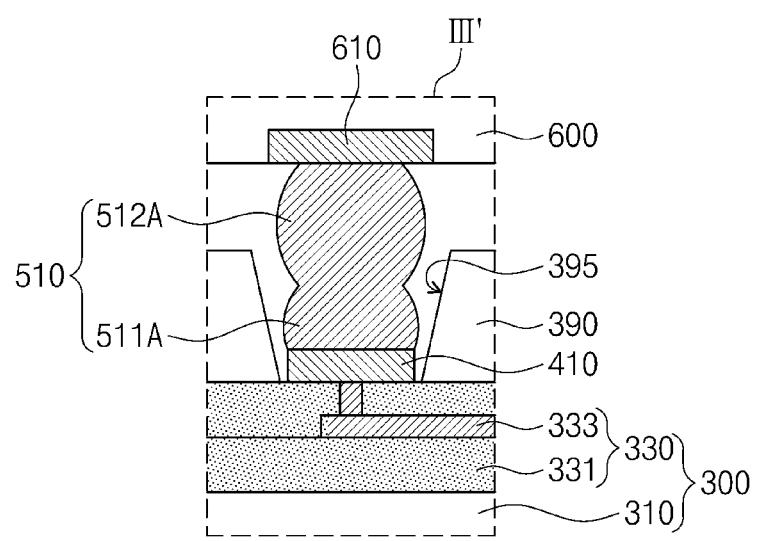
FIG. 3F is a cross-sectional view of still another version of the connection structure according to the present inventive concepts.

In the example of FIG. 3F, the connection structure 510 is spaced apart from the first molding layer 390, i.e., the connection structure 510 does not contact the surface of the first molding layer 390 defining the sides of the opening 395. The lower portion 511A of the connection structure 510 may originate from the first solder ball 511 shown in FIG. 1D. The upper portion 512A of the connection structure 510 may originate from one of the second solder balls 512 shown in FIG. 3C. The upper portion 512A of the connection structure 510 is connected to and hence, integral with the lower portion 511A of the connection structure 510.

Referring back to FIGS. 2A, 3A, 3B, and 3C, each of the connection structures 510 may include one or more of a solder ball, a bump, and a pillar. When viewed in plan, as shown in FIG. 3A, each of a first pad 410 and a corresponding one of the lower pads 610 overlap a respective connection structure 510. The connection structures 510 may be arranged at a pitch substantially the same as the first pitch P1 of the first pads 410 and the second pitch P10 of the lower pads 610. The interposer chip 300 may act as an electrical interface routing between the second semiconductor chip 700 and the first semiconductor chip 200 or between the second semiconductor chip 700 and the external terminals 110. The second semiconductor chip 700 may be electrically connected either to the first semiconductor chip 200 or to the external terminals 110 through the connection structures 510, the first pads 410, the redistribution patterns 333, the second pads 420, and the bonding wires 520.

If the first pads 410, the interposer chip 300, and the bonding wires 520 were not provided, the connection structures 510 would have to be directly coupled to second substrate pads 122 and corresponding ones of the lower pads 610. In this case, the second substrate pads 122 would be spaced apart from the first semiconductor chip 200 on the edge region of the first substrate 100. Accordingly, the second pitch P10 would be relatively large. For example, the second pitch P10 would be greater than the pitch P2 of the second substrate pads 122 in examples of the present inventive concept having the layout of FIG. 1A. Accordingly, it would be difficult to directly couple the connection structures 510 to the second substrate pads 122 and the lower pads 610. On the contrary, in examples according to the present inventive concepts, the interposer chip 300, the first pads 410, the second pads 420, and the bonding wires 520 are provided; therefore, there is great freedom of design in the arrangements of the first pads 410 and the connection structures 510. In particular, the first pads 410 may be aligned with the lower pads 610. The first pitch P1 of the first pads 410 may be substantially the same as the second pitch P10. Therefore, the connection structures 510 may be easily connected to the first pads 410 and the lower pads 610.

Certain applications may require that the second semiconductor chip 700 be a high performance chip. The second semiconductor chip 700 may include a plurality of second chip pads 710. The higher the storage capacity and/or storage speed of the second semiconductor chip 700, the greater is the number of the second chip pads 710. Thus, examples of a PoP according to the present inventive concepts may have a relatively large number of each of the connectors 720, the upper pads 620, and the lower pads 610. The standardization of the second pitch P10 may increase the number of the lower pads 610, and thus the lower pads 610 may be further distributed. Because the interposer chip 300 is provided, the first pads 410 and the connection structures 510 may be easily disposed at their locations that correspond to those of the lower pads 610. Therefore, even when the second semiconductor chip 700 is a high performance chip, it may be easy to electrically connect the second semiconductor chip 700 either to the first semiconductor chip 200 or to the external terminals 110 through the connection structures 510, the first pads 410, and the redistribution patterns 333.

In some examples, the area of a projection of the shape of the interposer chip 300 onto a horizontal plane, i.e., the projected area or "footprint" of the interposer chip 300 is relatively large. Such a projected area may be referred to hereinafter as "planar area". The larger the planar area of the interposer chip 300, the more freedom there is in arranging the first pads 410. It may thus be possible to more freely design the arrangement of the connection structures 510. For example, respective ones of the first pads 410 and ones of the connection structures 510 may be vertically juxtaposed with the first semiconductor chip 200. In other words, in a plan view, some of the first pads 410 and their associated connection structures 510 may lie within a region bounded by the first semiconductor chip 200. Other ones of the first pads 410 and connection structures 510 may not be vertically juxtaposed with the first semiconductor chip 200. Thus, in a plan view, others of the first pads 410 and their associated connection structures 510 lie outside the region bounded by the first semiconductor chip 200.

A gap may be provided between the first package 10 and the second package 20. For example, the first molding layer 390 may be spaced apart from the second substrate 600, and a gap may be provided between a top surface of the first molding layer 390 and the bottom surface of the second substrate 600. The gap may be occupied by a gas such as air and spatially communicate with the environment outside the semiconductor package PKG1.

Another example of a semiconductor package PKG2, namely, a second PoP, according to the present inventive concepts is illustrated in FIGS. 4A-5B.

Referring to FIGS.

4A, 4B, 5A, and 5B, the semiconductor package PKG2 includes a first package 10 and a second package 20'. The first package 10 may be the same as the first package 10 discussed above with reference to FIGS. 1A and 1B.

Figure 4A:
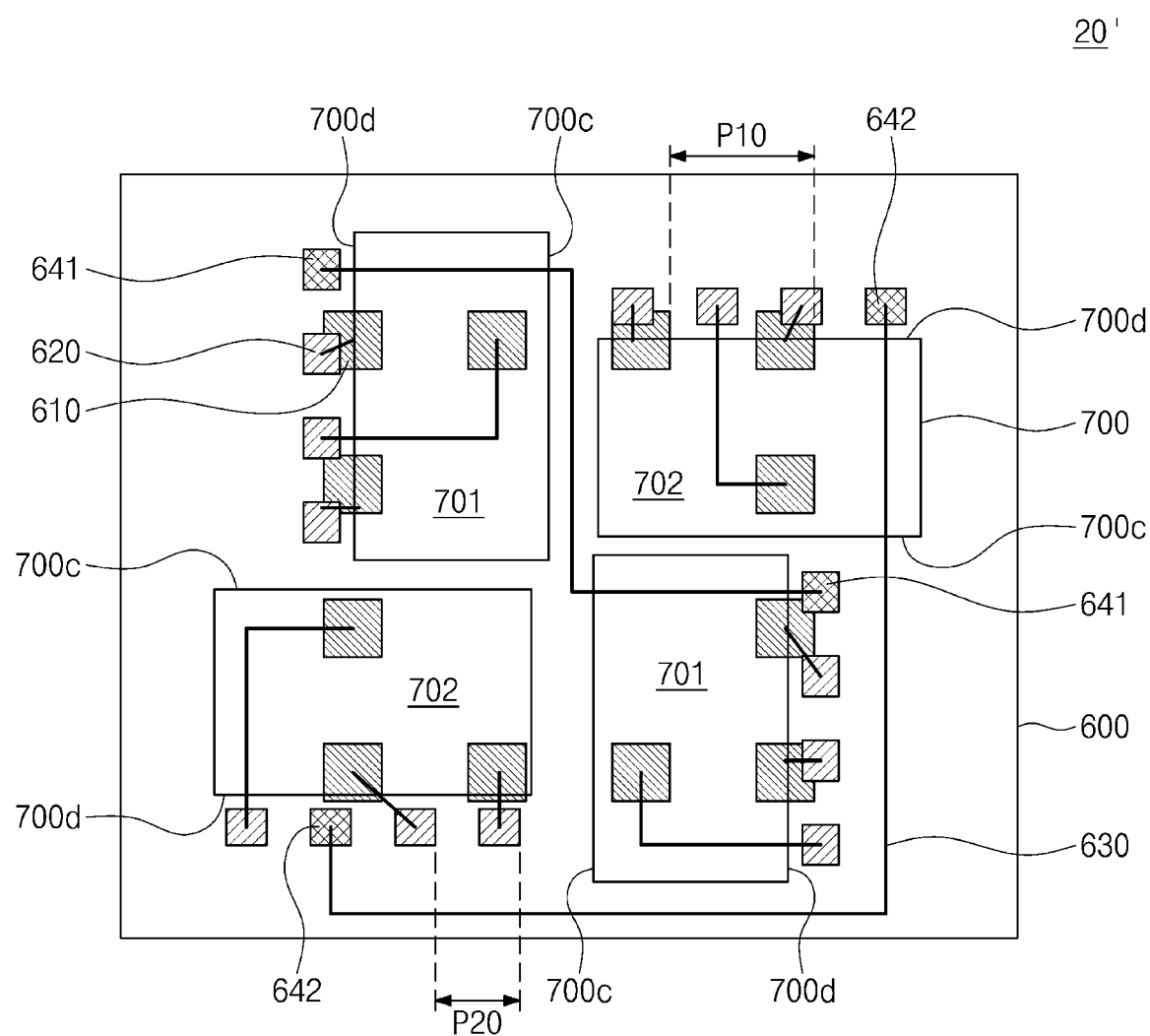
FIG. 4A is a layout diagram of an example of a second package of a semiconductor package according to the present inventive concepts.
Figure 4B:
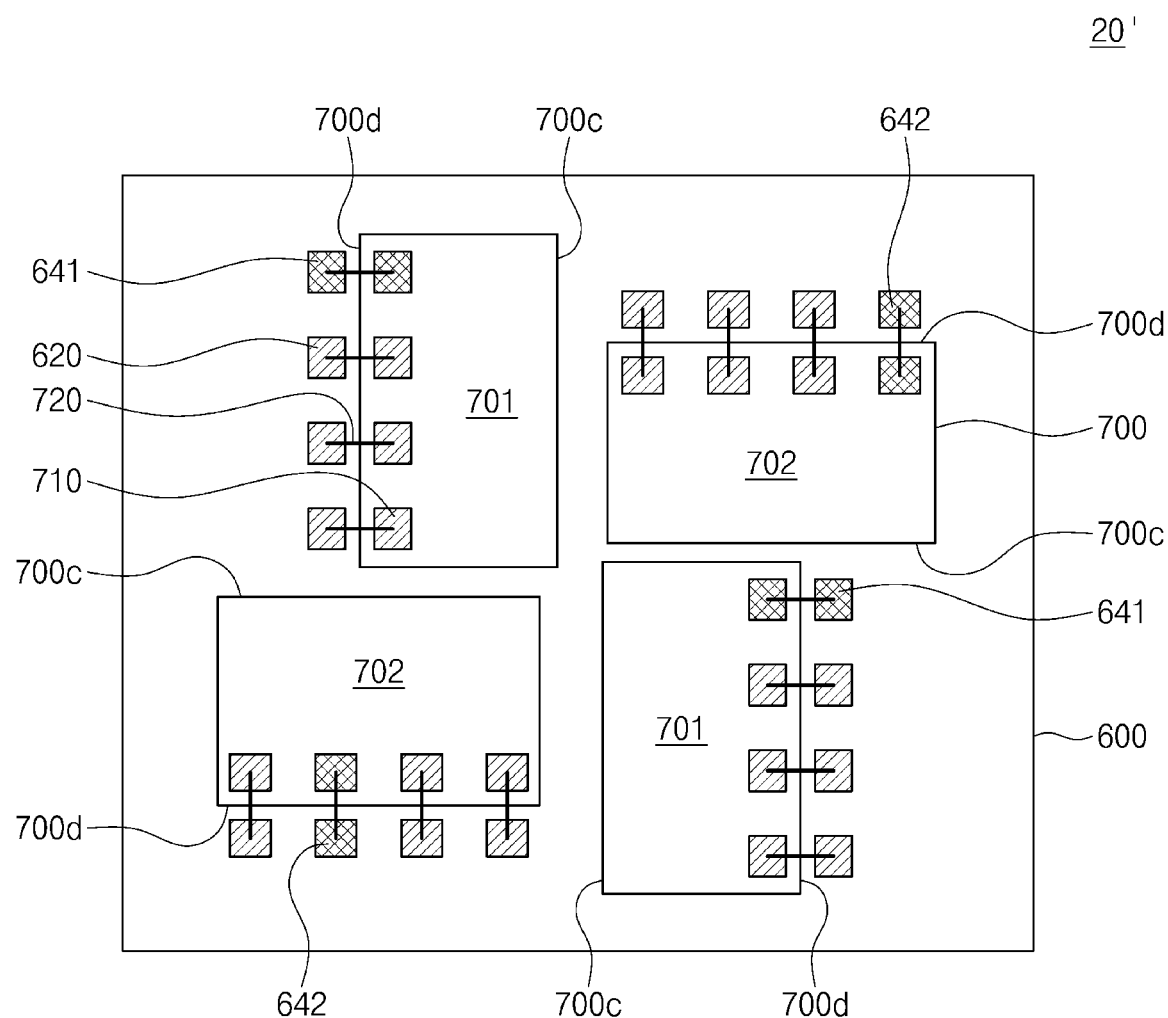
FIG. 4B is a plan view of electrical connections between a second substrate and a second semiconductor chip of the second package having the layout shown in FIG. 4A.
Figure 5A:
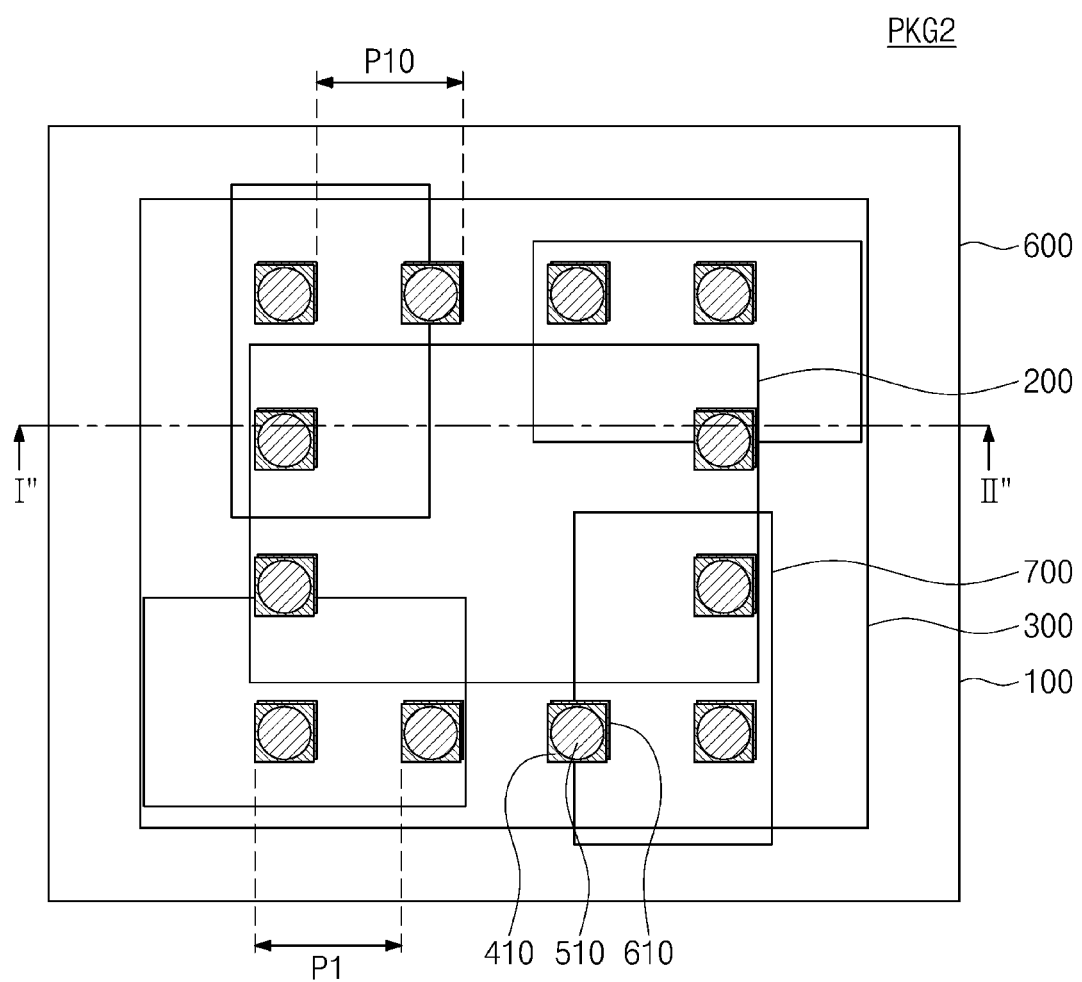
FIG. 5A is a layout diagram of an example of a semiconductor package having the second package of FIGS. 4A and 4B according to the present inventive concepts.
Figure 5B:
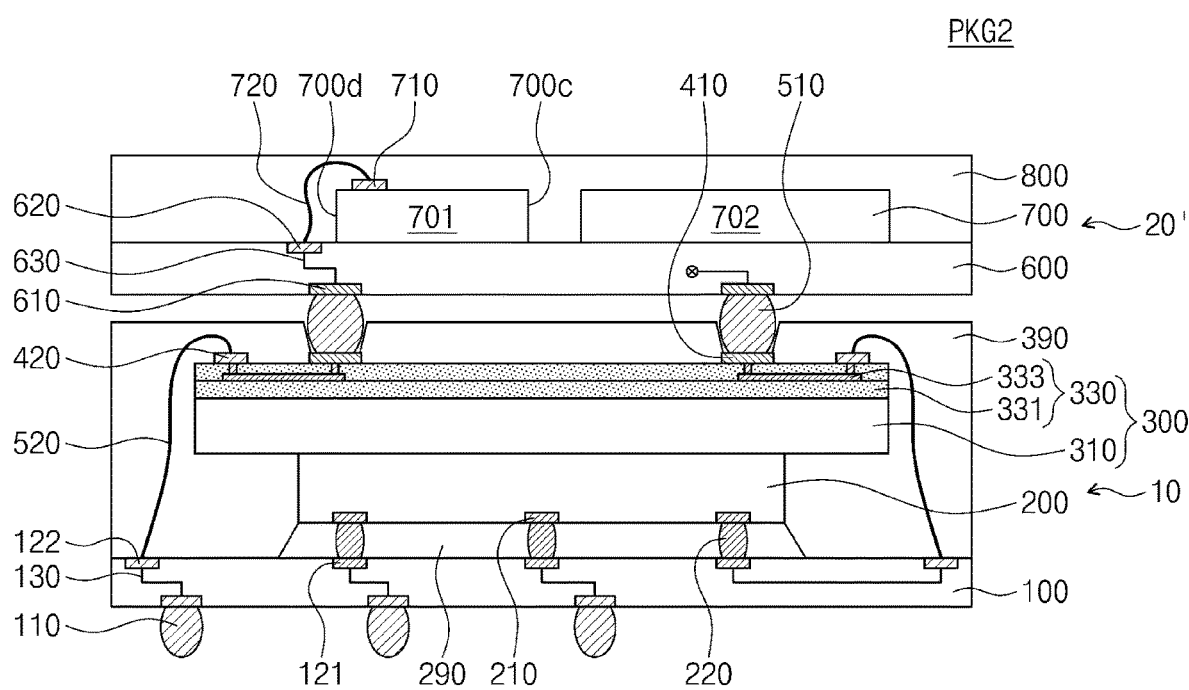
FIG. 5B is a cross-sectional view of an example of a semiconductor package having the second package of FIGS. 4A and 4B according to the present inventive concepts and a layout as shown in FIG. 5A, as taken in a direction corresponding to that of line I"-II" of FIG. 5A.

The second package 20' may include a second substrate 600, a second semiconductor chip 700, and a second molding layer 800. A plurality of the second semiconductor chips 700 may be provided. Each of the second semiconductor chips 700 may have a first side surface 700c and a second side surface 700d facing in opposite directions. As shown in FIGS. 4A and 4B, the first side surface 700c of each of the second semiconductor chips 700 may face another one of the second semiconductor chips 700. The second side surface 700d of each of the second semiconductor chips 700 may not face any of the other second semiconductor chips 700. The second side surfaces 700d of the second semiconductor chips 700 may be closer than the first side surfaces 700c of the second semiconductor chips 700 to the edge region of the second substrate 600. The second chip pads 710 may be provided on the top surfaces of the second semiconductor chips 700. As shown in FIG. 4B, second chip pads 710 may be adjacent to the second side surface 700d of the second semiconductor chip 700. As shown in FIGS. 4B and 5B, the connectors 720 may be coupled to the second chip pads 710 and the upper pads 620. The upper pads 620 may be spaced laterally from the second semiconductor chips 700. The upper pads 620 may be adjacent to the second side surface 700d of the second semiconductor chip 700 connected thereto. As shown in FIG. 4A, the upper pads 620 may be coupled through the internal lines 630 to the lower pads 610. A large number of the lower pads 610 may be provided to account for the provision of a plurality of the second semiconductor chips 700. The second pitch P10 may be standardized. The second pitch P10 may be greater than the pitch P20 of the upper pads 620.

Because the interposer chip 300 is provided, the connection structures 510 may be arranged with a high degree of freedom. As shown in FIG. 5A, the first pads 410 may be easily aligned with the lower pads 610. Accordingly, the connection structures 510 may be connected to corresponding first pads 410 and corresponding lower pads 610. Each second semiconductor chip 700 may be electrically connected either to the first semiconductor chip 200 or to the external terminals 110 through the connection structures 510, the first pads 410, the redistribution patterns 333, and the bonding wires 520.

Examples of electrical connections between the second semiconductor chips 700 will be described in the following.

The second semiconductor chips 700 may include first sub-semiconductor chips 701 and second sub-semiconductor chips 702. The first sub-semiconductor chips 701 are not disposed side-by-side adjacent to each other. As shown in FIG. 4A, first chip connection pads 641 may further be provided on the top surface of the second substrate 600. The first chip connection pads 641 may be electrically connected to each other through the internal lines 630. The first chip connection pads 641 may be electrically separated from the lower pads 610. As shown in FIG. 4B, the connectors 720 may be coupled to the second chip pads 710 and the first chip connection pads 641. The first sub-semiconductor chips 701 may be electrically connected to each other through the first chip connection pads 641. Accordingly, although the first sub-semiconductor chips 701 are physically separated from each other, the first sub-semiconductor chips 701 may perform functions of a single semiconductor chip defined by a certain standard. The certain standard may be a JEDEC standard.

The second sub-semiconductor chips 702 are not disposed side-by-side adjacent to each other. Second chip connection pads 642 may further be provided on the top surface of the second substrate 600. As shown in FIG. 4B, the second sub-semiconductor chips 702 may be coupled through the connectors 720 to the second chip connection pads 642. As shown in FIG. 4A, the second chip connection pads 642 may be electrically connected to each other through the internal lines 630. Accordingly, the second sub-semiconductor chips 702 may be electrically connected to each other. Although the second sub-semiconductor chips 702 are physically separated from each other, the second sub-semiconductor chips 702 may perform functions of a single semiconductor chip defined by a certain standard (e.g., a JEDEC standard). The second chip connection pads 642 may be electrically separated from the lower pads 610 and the first chip connection pads 641.

In another example, the first chip connection pads 641 are connected to the second chip connection pads 642, and thus the first sub-semiconductor chips 701 and the second sub-semiconductor chips 702 may perform functions of a single semiconductor chip. In still another example, the first chip connection pads 641 are omitted, and each of the first sub-semiconductor chips 701 may act as a single semiconductor chip. In yet another example, the second chip connection pads 642 are omitted, and each of the second sub-semiconductor chips 702 may act as a single semiconductor chip.

Figure 6A:
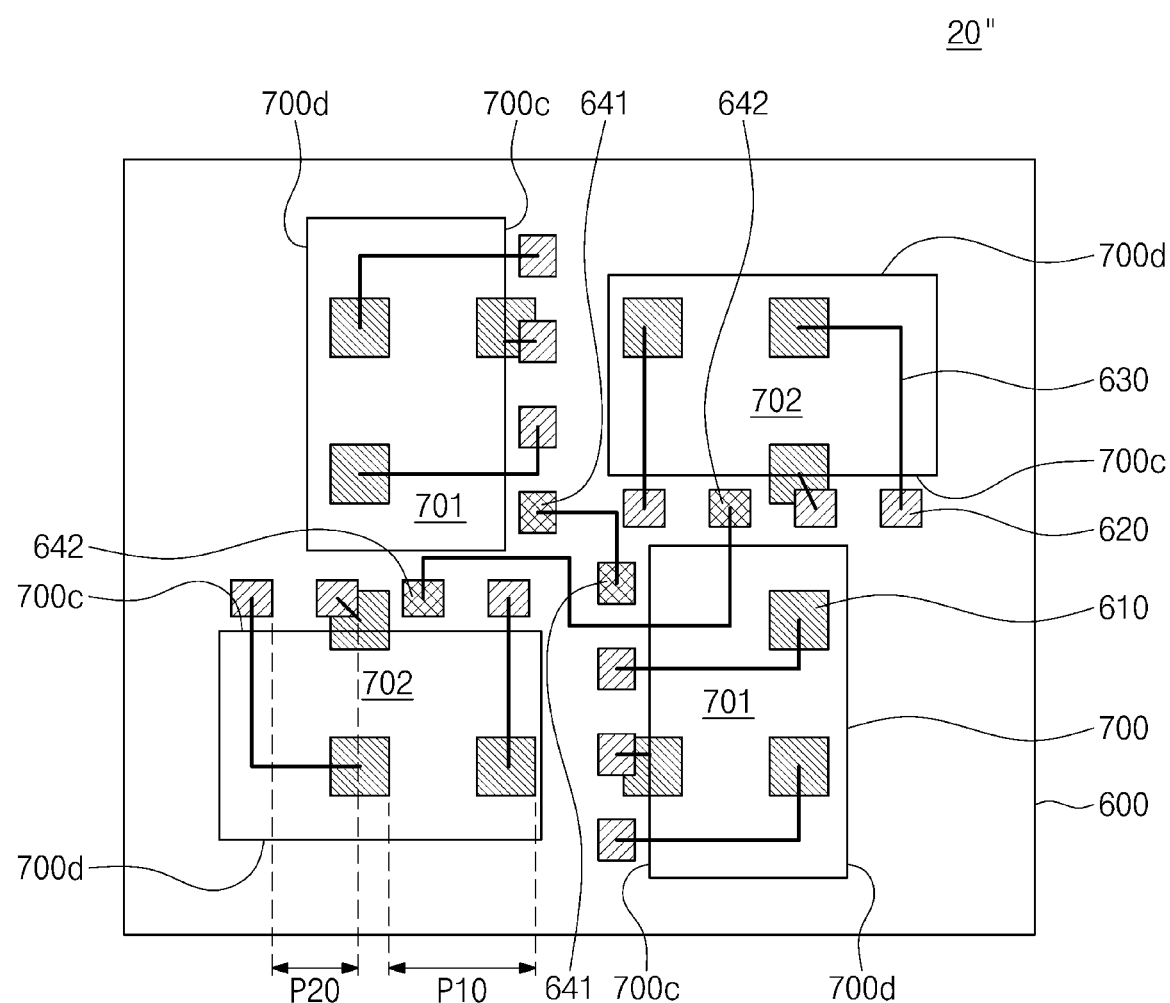
FIG. 6A is a layout diagram of another example of a second package of a semiconductor package according to the present inventive concepts.
Figure 6B:
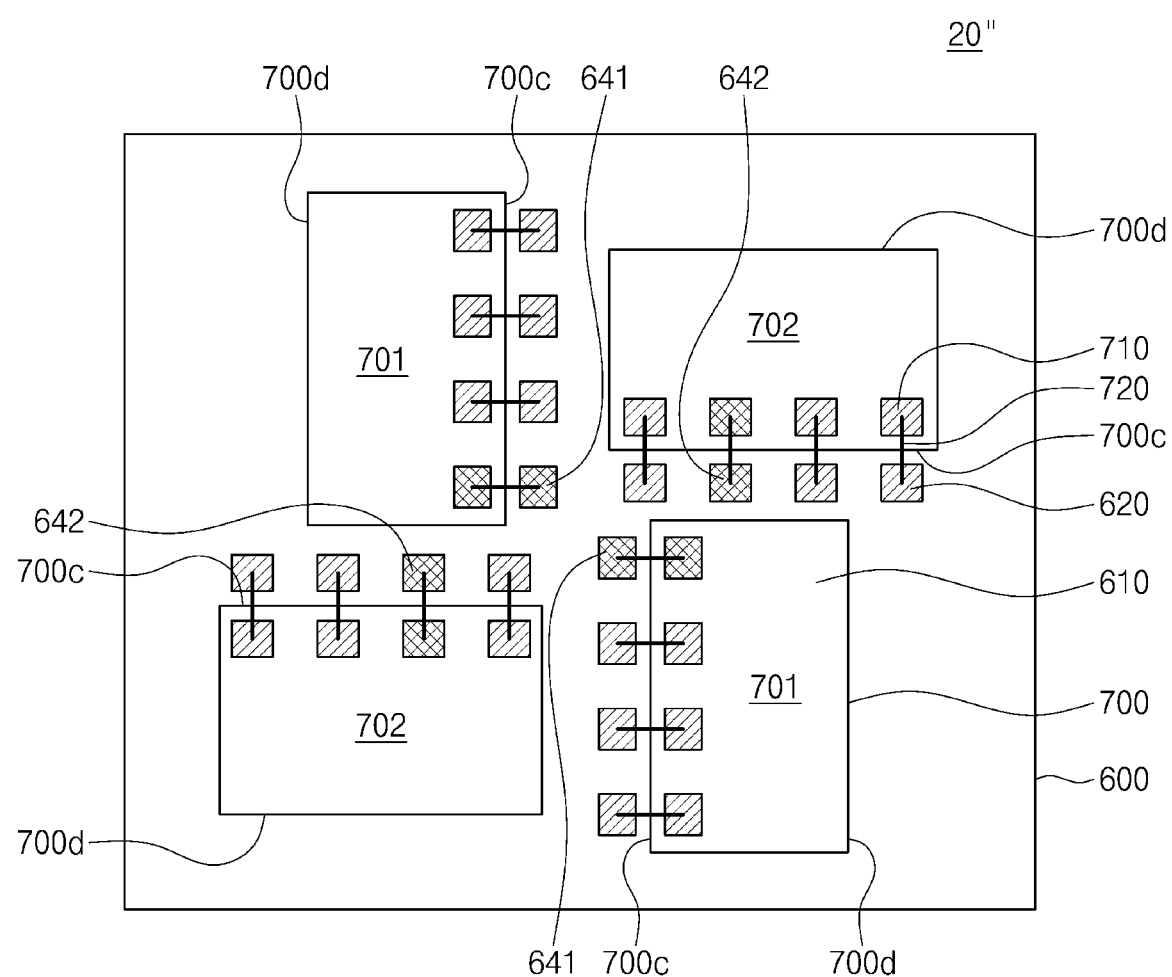
FIG. 6B is a plan view of electrical connections between a second substrate and a second semiconductor chip of the second package having the layout shown in FIG. 6A.

Another version of the second semiconductor package PKG2 according to the present inventive concepts is illustrated by FIGS. 6A and 6B.

The semiconductor package PKG2 has a second package 20" including a second substrate 600, second semiconductor chips 700, and a second molding layer 800. The second semiconductor chips 700 may be substantially the same as those described above with reference to FIGS. 4A, 4B, 5A, and 5B except that at the top surface of each second semiconductor chip 700, the second chip pads 710 are adjacent to the first side surface 700c. One or more of the upper pads 620 may be disposed on the central region of the second substrate 600. The first chip connection pads 641 and the second chip connection pads 642 may be provided on the top surface of the second substrate 600.

The planar arrangements of the upper pads 620 and the second chip pads 710 are not be limited to those shown in FIGS. 4A to 6B. For example, the second chip pads 710 may include first sub-chip pads adjacent to the first side surface 700c of the second semiconductor chip 700 and second sub-chip pads adjacent to the second side surface 700d of the second semiconductor chip 700. In another example, the second chip pads 710 include third sub-chip pads adjacent to a third side surface of the second semiconductor chip 700. The third side surface of the second semiconductor chip 700 neighbors the first side surface 700c and the second side surface 700d.

Figure 7:
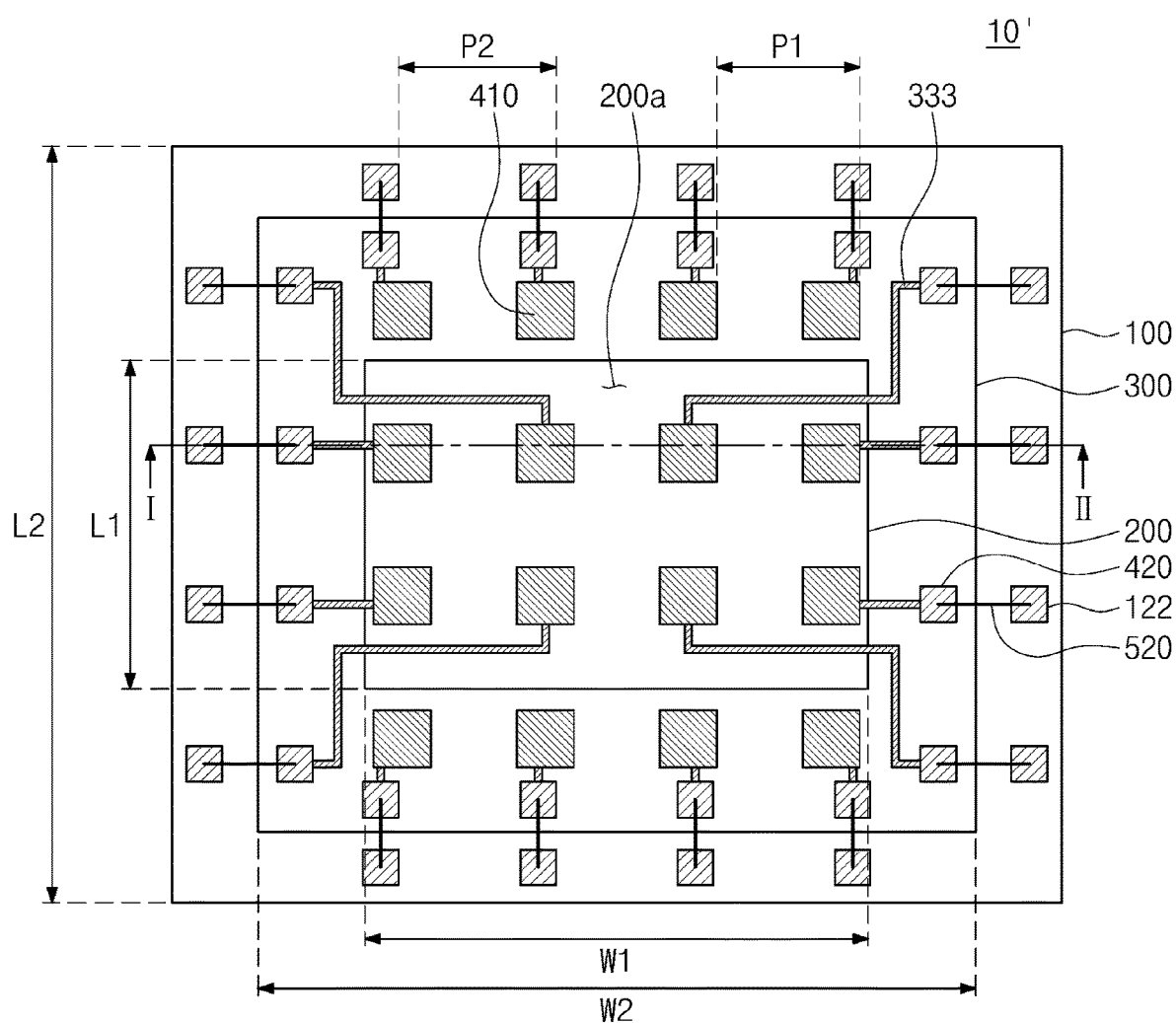
FIG. 7 is a layout diagram of another example of a first package of a semiconductor package according to the present inventive concepts.

Another example of a semiconductor package PKG3 according to the present inventive concepts is illustrated in FIG. 7 to. FIG. 9B The semiconductor package PKG3 includes a first package 10' and a second package 20'''. The first package 10' may be substantially the same as that described above with reference to FIGS. 1A to 1C except that, as shown in FIG. 7, when viewed in plan, one or more of the first pads 410 lies on a central region of the first substrate 100. Each of the first pads 410 may be electrically connected to one of the second substrate pads 122 through the redistribution pattern 333, the second pad 420, and the bonding wire 520. The first pitch P1 may be greater than the pitch P2 of the second substrate pads 122.

Figure 8:
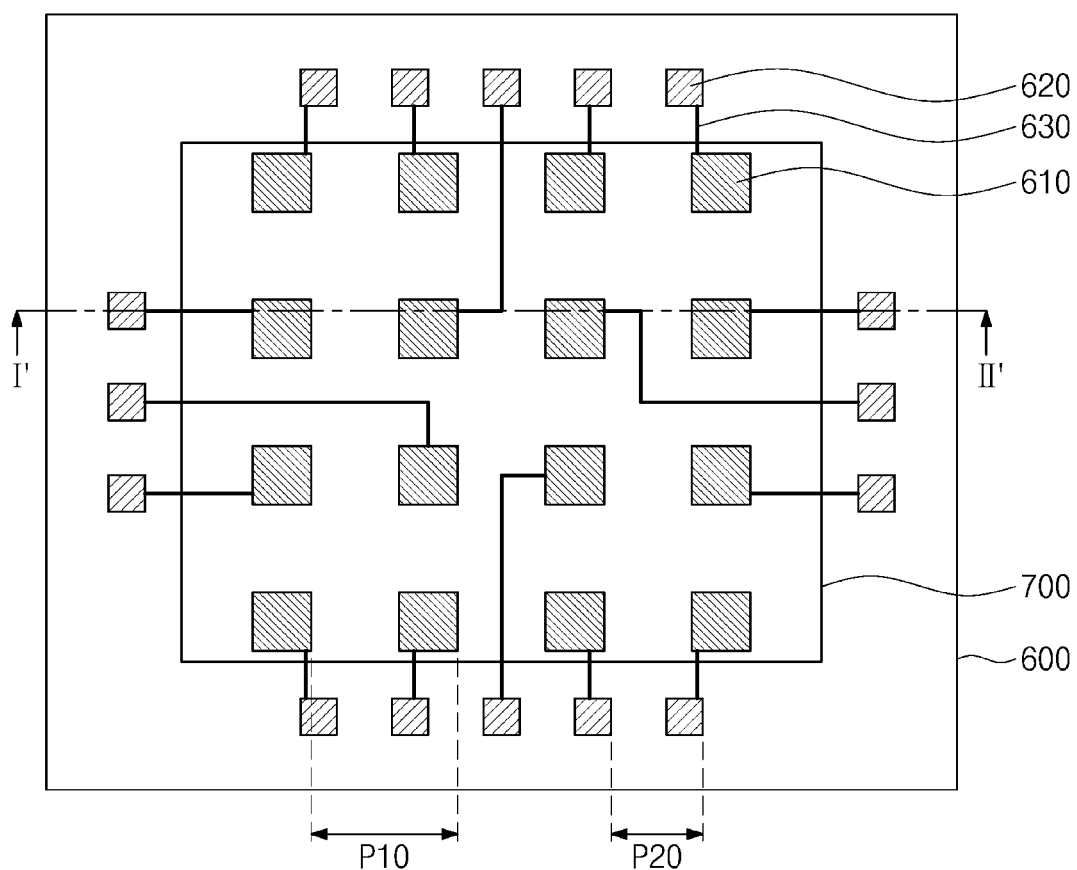
FIG. 8 is a layout diagram of another example of a second package of a semiconductor package according to the present inventive concepts.

As shown in FIGS. 8 and 9B, the upper pads 620 are spaced apart from the second semiconductor chip 700. When viewed in plan, the upper pads 620 may be disposed alongside the edge region of the second substrate 600. The upper pads 620 may be electrically connected through the internal lines 630 to the lower pads 610. The lower pads 610 may be provided not only on the central region of the second substrate 600 but also on the edge region of the second substrate 600. As shown in FIG. 8, the second pitch P10 may be greater than the pitch P20 of the upper pads 620.

Figure 9A:
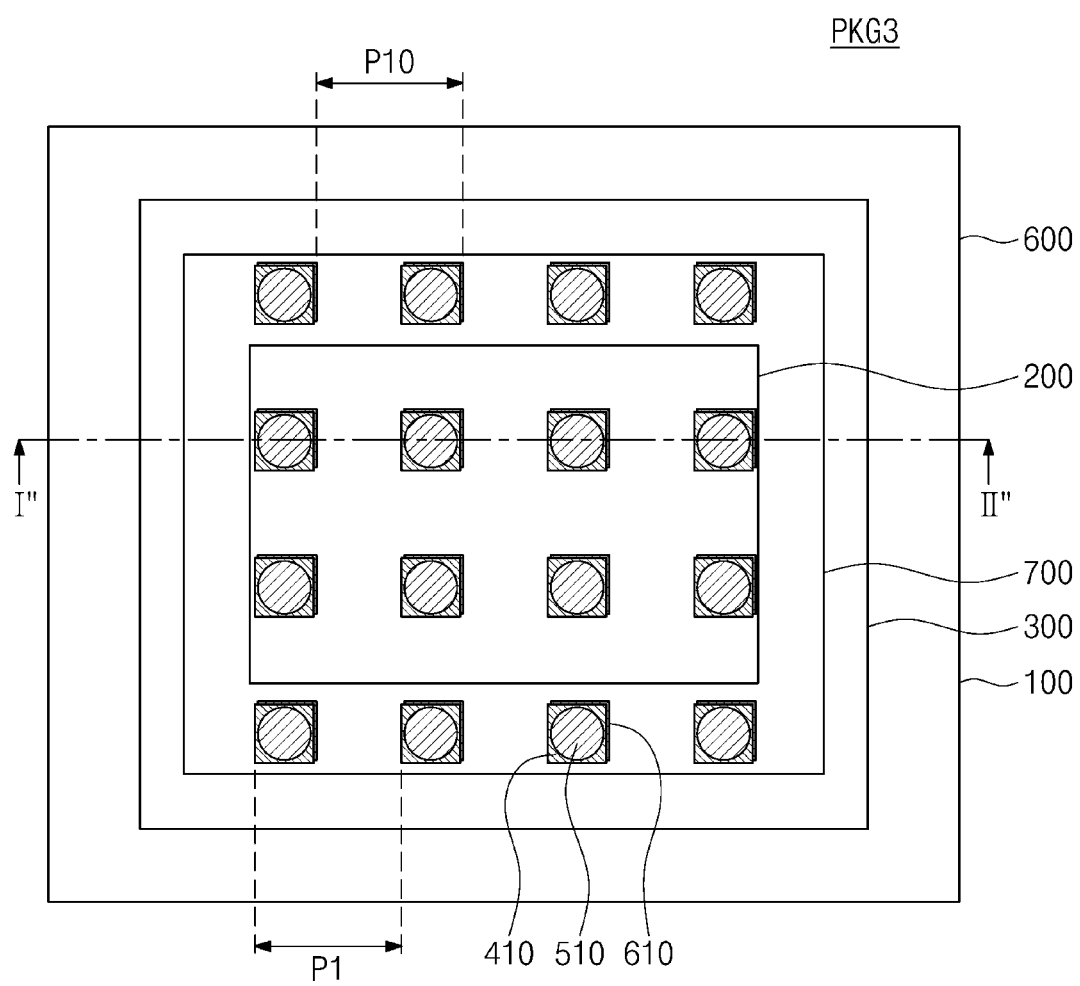
FIG. 9A is layout diagram of another example of a semiconductor package according to the present inventive concepts.
Figure 9B:
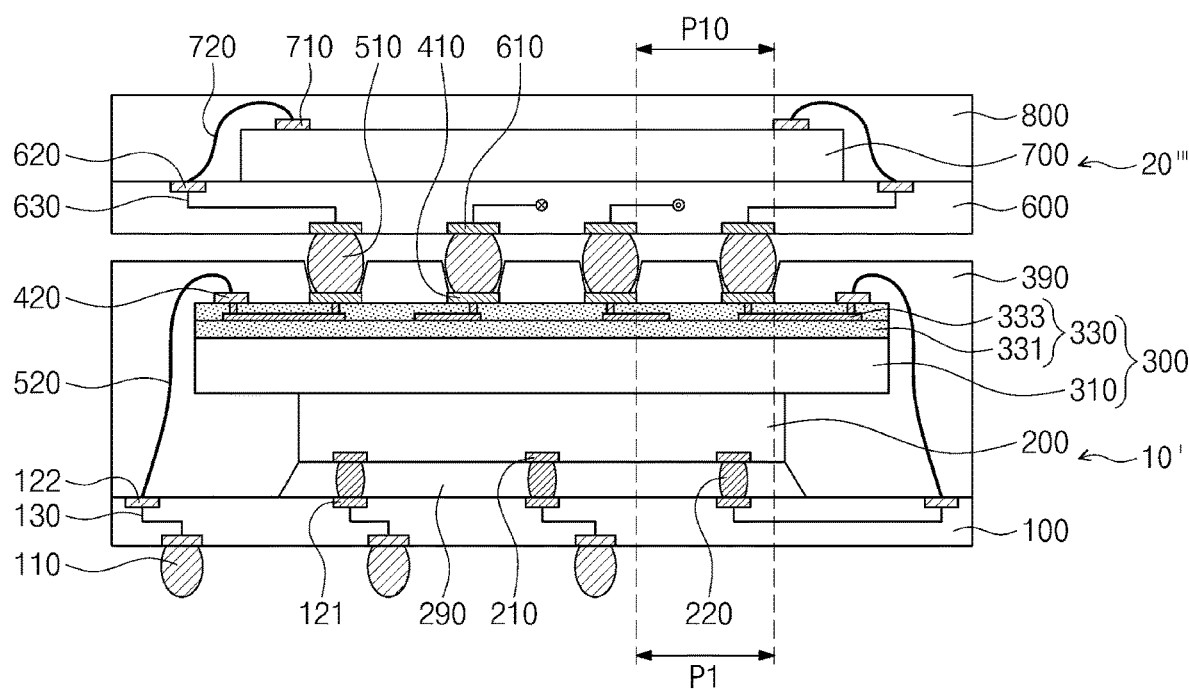
FIG. 9B is a cross-sectional view of an example of a semiconductor package having the layout shown in FIG. 9A and as taken in a direction corresponding to that of line I"-II" of FIG. 9A.

As shown in FIGS. 9A and 9B, the connection structures 510 may be respectively provided between the first pads 410 and the lower pads 610. The connection structures 510 may be arranged at a pitch substantially the same as the first pitch P1 and the second pitch P10. The connection structures 510 may be coupled to corresponding first pads 410 and corresponding lower pads 610.

Figure 10A:
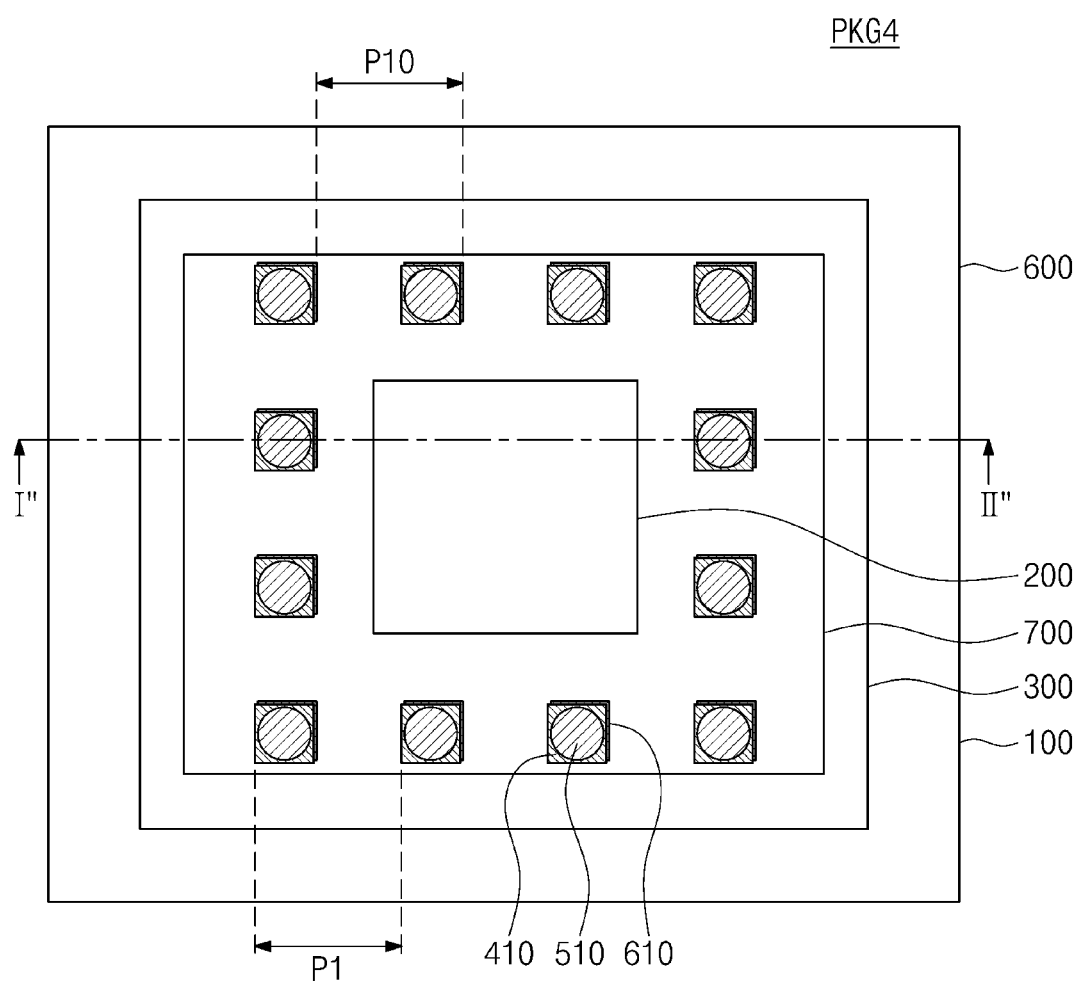
FIG. 10A is a layout diagram of another example of a semiconductor package according to the present inventive concepts.
Figure 10B:
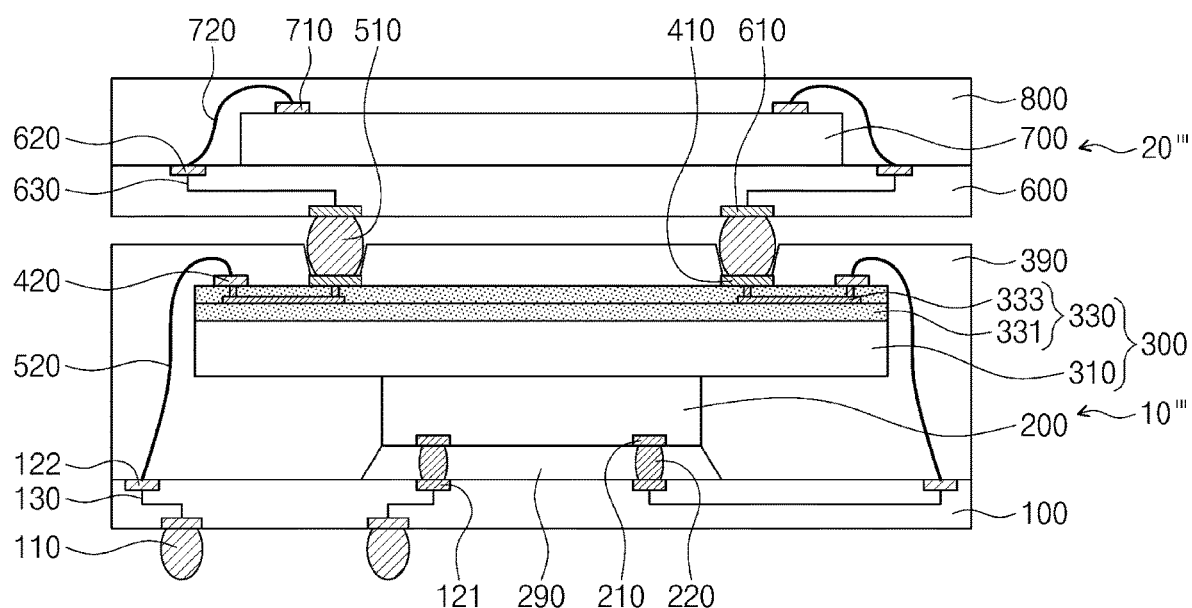
FIG. 10B is a cross-sectional view of an example of a semiconductor package having the layout shown in FIG. 10A and as taken in a direction corresponding to that of line I"-II" of FIG. 10A.

Another example of a semiconductor package PKG4 according to the present inventive concepts is illustrated in FIGS. 10A and 10B.

The semiconductor package PKG4 includes a first package 10'' and a second package 20'''. The first package 10'' may be substantially the same as that described above with reference to FIGS. 1A to 1C except that, when viewed in plan, the first pads 410 do not lie on the first semiconductor chip 200. The second package 20''' may be substantially the same as that described above with reference to FIGS. 8 and 9B. For example, the lower pads 610 may be disposed on the edge region of the second substrate 600. The second pitch P10 of the lower pads 610 may be greater than the pitch P20 of the upper pads 620. The connection structures 510 may be coupled to corresponding first pads 410 and corresponding lower pads 610. As shown in FIG. 10A, when viewed in plan, the connection structures 510 may lie on the lower pads 610 and the first pads 410. When viewed in plan, the connection structures 510 do not lie on the first semiconductor chip 200.

Figure 11:
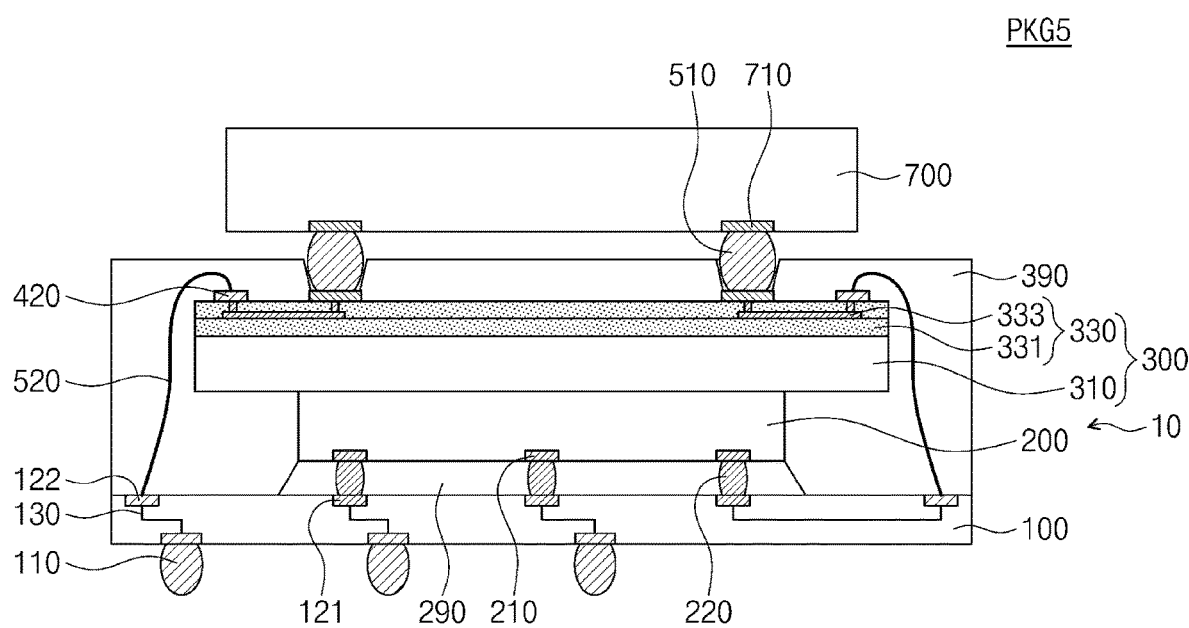
FIG. 11 is a cross-sectional view of still another example of a semiconductor package according to the present inventive concepts.

FIG. 11 illustrates an example of a semiconductor package PKG5 according to the inventive concepts.

The semiconductor package PKG5 includes a first package 10 and a second semiconductor chip 700. The first package 10 may be substantially the same as that described above with reference to FIGS. 1A to 1C. The bottom surface of the second semiconductor chip 700 may be an active surface. Thus, the second chip pads 710 may be provided at the bottom surface of the second semiconductor chip 700. The connection structure 510 may be provided between the first pad 410 and the second chip pad 710 and may be coupled to the first pad 410 and the second chip pad 710.

As another version of the semiconductor package PKG5 according to the present inventive concepts, the second semiconductor chip 700 is mounted on the second package 20' described with reference to FIGS. 6A and 6B.

According to the present inventive concepts, an interposer chip may have such a high thermal conductivity that heat generated from a first semiconductor chip may be promptly released through the interposer chip. Accordingly, the first semiconductor chip may have excellent operational reliability.

Because the interposer chip is provided, first pads and connection structures may be arranged with high degrees of freedom. Thus, the first pads and the connection structures may be easily aligned with lower pads. The connection structures may be effortlessly coupled to the first pads and the lower pads.

Finally, examples of the present inventive concepts have been described above in detail. The inventive concepts may, however, be put into practice in many different ways and should not be construed as being limited to the examples described above. Rather, these examples were described so that this disclosure is thorough and complete, and fully conveys the inventive concepts to those skilled in the art. Thus, the true spirit and scope of the inventive concepts is not limited by the examples described above but by the following claims.

What is claimed is:

1. A semiconductor package, comprising:
   a first substrate;
   a first semiconductor chip disposed on and mounted to the first substrate;
   an interposer chip on the first semiconductor chip;
   a first pad disposed on the interposer chip;
   a second pad disposed on the interposer chip and spaced apart from the first pad; and
   a bonding wire electrically connected to the second pad and the first substrate,
   wherein the second pad is electrically connected through the interposer chip to the first pad, and
   the interposer chip has a footprint greater than that of the first semiconductor chip.

2. The semiconductor package of claim 1, wherein the interposer chip has a thermal conductivity in a range of 30 W/mK to 2000 W/mK.

3. The semiconductor package of claim 1, further comprising a solder ball on the first pad.

4. The semiconductor package of claim 1, wherein the interposer chip completely covers a top surface of the first semiconductor chip.

5. The semiconductor package of claim 1, further comprising a substrate pad on the first substrate and coupled to the bonding wire,
   wherein the first pad constitutes one of a plurality of first pads adjacent one side of the semiconductor package, the substrate pad constitutes one of a plurality of substrate pads adjacent said one side of the semiconductor package, the plurality of first pads have a first pitch by which the first pads are spaced from each other in a direction parallel to said one side of the semiconductor package, the plurality of substrate pads have a second pitch by which the plurality of substrate pads are spaced from each other in the direction parallel to said one side of the semiconductor package, and the first pitch is greater than the second pitch.

6. The semiconductor package of claim 1, further comprising a molding layer on the first substrate and the interposer chip,
wherein the molding layer covers the second pad but not the first pad.

7. The semiconductor package of claim 1, further comprising:
an upper package on the interposer chip; and
a connection structure interposed between and electrically connecting the upper package and the first pad.

8. The semiconductor package of claim 7, wherein the upper package includes:
a second substrate;
a second semiconductor chip disposed on and mounted to the second substrate;
a plurality of upper pads on a top surface of the second substrate, the upper pads electrically connected to the second semiconductor chip; and
a plurality of lower pads on a bottom surface of the second substrate and electrically connected to the upper pads,
wherein a pitch of the lower pads is greater than a pitch of the upper pads.

9. The semiconductor package of claim 8, wherein the second semiconductor chip is a memory chip, and the semiconductor package includes at least one other memory chip disposed on and mounted to the second substrate.

10. The semiconductor package of claim 1, wherein, when viewed in plan, the first pad lies within a region bounded by the first semiconductor chip.

11. A semiconductor package, comprising:
a first substrate including a substrate pad;
a first semiconductor chip disposed on and mounted to the first substrate;
an interposer chip disposed on the first semiconductor chip and including a redistribution layer comprising a wiring pattern;
a solder ball on a top surface of the interposer chip; and
a bonding wire extending from the top surface of the interposer chip, the bonding wire coupled to the substrate pad,
wherein the solder ball is electrically connected through the redistribution layer to the bonding wire, and
the interposer chip has a width, in a direction parallel to an upper surface of the first substrate, greater than a width of the first semiconductor chip in said direction.

12. The semiconductor package of claim 11, wherein, when viewed in plan, the first semiconductor chip lies completely in a region bounded by the interposer chip.

13. The semiconductor package of claim 11, wherein the interposer chip has a thermal conductivity in a range of from 30 W/mK to 2000 W/mK.

14. The semiconductor package of claim 11, further comprising an adhesive layer between the first semiconductor chip and the interposer chip,
wherein the adhesive layer has a thermal conductivity in a range of 0.2 W/mK to 10 W/mK.

15. The semiconductor package of claim 11, further comprising:
a first pad between the interposer chip and the solder ball;
a second pad on the top surface of the interposer chip, the second pad coupled to the bonding wire; and
a molding layer on the interposer chip,
wherein the molding layer covers the second pad but not the solder ball.

16. The semiconductor package of claim 11, wherein the first semiconductor chip has an active surface facing the first substrate.

17. A semiconductor package, comprising:
a first substrate including an insulating body, and first substrate pads and second substrate pads of electrically conductive material at a top surface of the insulating body;
a first semiconductor chip flip-chip mounted to the first substrate as disposed on and electrically connected to the first substrate pads of the first substrate;
an interposer on the first semiconductor chip, the interposer having an upper portion including a redistribution layer comprising wiring patterns;
a plurality of first pads of electrically conductive material disposed on the interposer;
a plurality of second pads of electrically conductive material disposed on the interposer and spaced laterally outwardly of the plurality of first pads;
bonding wires electrically connecting the second pads disposed on the interposer and the second substrate pads, respectively; and
a molding layer disposed on the first substrate and in which the interposer, the first semiconductor chip and the bonding wires are encapsulated,
wherein the second pads are electrically connected by the wiring patterns of the redistribution layer of the interposer to the first pads, and
the molding layer has a plurality of openings therein that leads to and opens at the plurality of first pads disposed on the interposer.

18. The semiconductor package of claim 17, wherein respective ones of the first pads are disposed adjacent one side of the interposer,
respective ones of the second pads are disposed adjacent said one side of the interposer,
said respective ones of the first pads have a first pitch by which they are spaced from each other in a direction parallel to said one side of the interposer,
said respective ones of the second pads have a second pitch by which they are spaced from each other in the direction parallel to said one side of the interposer, and
the first pitch is greater than the second pitch.

19. The semiconductor package of claim 17, wherein the interposer has a thermal conductivity in a range of from 30 W/mK to 2000 W/mK.

20. The semiconductor package of claim 17, further comprising:
a second semiconductor chip disposed on the molding layer; and
a plurality of electrical connectors interposed between the second semiconductor chip and the plurality of first pads disposed on the interposer as disposed in contact with the first pads, respectively,
wherein the second semiconductor chip is electrically connected by at least some of the electrical connectors to the redistribution layer.

* * * * *